United States Patent
Komatsu et al.

(10) Patent No.: US 7,616,519 B2
(45) Date of Patent: Nov. 10, 2009

(54) SEMICONDUCTOR INTEGRATED CIRCUIT DEVICE

(75) Inventors: Shigenobu Komatsu, Kokubunji (JP); Masanao Yamaoka, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 101 days.

(21) Appl. No.: 11/812,193

(22) Filed: Jun. 15, 2007

(65) Prior Publication Data
US 2007/0297270 A1 Dec. 27, 2007

(30) Foreign Application Priority Data
Jun. 26, 2006 (JP) ............... 2006-174725

(51) Int. Cl.
*G11C 8/00* (2006.01)
(52) U.S. Cl. ............... 365/230.05; 365/233.11; 365/233.12
(58) Field of Classification Search ............ 365/233.11, 365/189.08, 230.05, 233.12
See application file for complete search history.

(56) References Cited

U.S. PATENT DOCUMENTS

| 5,774,410 | A | * | 6/1998 | Nakase | ............... | 365/230.05 |
| 6,327,212 | B1 | * | 12/2001 | Ishikawa et al. | ............ | 365/226 |
| 6,449,197 | B1 | * | 9/2002 | Hiraki et al. | ............ | 365/189.05 |
| 6,463,529 | B1 | * | 10/2002 | Miller et al. | ............ | 713/2 |
| 6,523,132 | B1 | * | 2/2003 | Harari et al. | ............ | 714/8 |
| 6,788,616 | B2 | * | 9/2004 | Takahashi | ............ | 365/230.01 |
| 2002/0018394 | A1 | * | 2/2002 | Takahashi | ............ | 365/233 |

FOREIGN PATENT DOCUMENTS

| JP | 8-212784 A | 8/1996 |
| JP | 2005-85344 A | 3/2005 |

* cited by examiner

*Primary Examiner*—Tuan T Nguyen
*Assistant Examiner*—Hien N Nguyen
(74) *Attorney, Agent, or Firm*—Miles & Stockbridge P.C.

(57) ABSTRACT

The present invention provides a technique capable of achieving area reduction on a semiconductor integrated circuit device mounted with a time sharing virtual multi port memory or the like. By providing a configuration including a single port memory, data latch circuit for plural ports, a selector for selecting a port to be connected to the single port memory, a time sharing control signal generating circuit and the like, in which an operation termination signal inside the single port memory (a word line rising signal, a sense amplifier driving signal for data read or the like) is inputted to the time sharing control signal generating circuit to produce a port switching control signal and an operation control signal for the single port memory, a time sharing virtual multi port memory with a reduced area can be realized which requires no clock generating circuit for time sharing control newly.

15 Claims, 25 Drawing Sheets

SEMICONDUCTOR INTEGRATED CIRCUIT DEVICE

CROSS-REFERENCE TO RELATED APPLICATION

The present application claims priority from Japanese Patent Application No. JP 2006-174725 filed on Jun. 26, 2006, the content of which is hereby incorporated by reference into this application.

TECHNICAL FIELD OF THE INVENTION

The present invention relates to a semiconductor integrated circuit device, and in particular to a technique which is effective in application of a configuration of a semiconductor integrated circuit device mounted with a time sharing virtual multi port memory or the like.

BACKGROUND OF THE INVENTION

As techniques that have examined by the present inventors, for example, there are the following techniques in a semiconductor integrated circuit device mounted with a time sharing virtual multi port memory or the like.

A technique described in Japanese Patent Application Laid-Open Publication No. 8-212784 (Patent Document 1) is that by controlling an internal portion of the memory in a time sharing virtual multi port memory using memory cells with a small area by clocks which is the same frequency with that of an external portion thereof, an external clock time can be made shorter than an access time. The time sharing virtual multi port memory is realized by a constitution including a latch circuit, an internal memory, a multiplexer circuit, a circuit to allocate data, and a PLL circuit. The multiplexer circuit and the circuit to allocate data, the internal memory, and the latch circuit are controlled by a clock signal that is generated by the PLL circuit and is higher in frequency than the external clock, and data corresponding to plural ports is processed in a time sharing manner.

A technique described in Japanese Patent Application Laid-Open Publication No. 2005-85344 (Patent Document 2) is that, in a configuration including a memory core provided with a port allowing input/output of a signal and a port extending circuit that is connected to the memory core and can extend a port of the memory core by time sharing, by providing a port switching circuit that can perform switching a port realized by time sharing, a layout of a semiconductor storage device is standardized, regardless of the number of ports or a port function, a setting of a port realized by time sharing according to a user specification is made possible and cost reduction of a multi port RAM in a time sharing system is achieved. An internal clock for controlling an operation timing of an internal memory is generated by a delay device that can set a pulse width.

SUMMARY OF THE INVENTION

Note that, as a result of the present inventors' examination about the techniques of such semiconductor integrated circuit devices, the followings became clear.

Now, many memories are mounted on a semiconductor integrated circuit device with a large scale, and an occupation ratio of memories to a whole chip area is large. Therefore, reduction of the area of a memory is effective for area reduction of a whole semiconductor integrated circuit device.

The memory itself is composed of a memory cell array holding data, and a peripheral circuit such as an address decoder, a word driver, an amplifier, and the like. An occupation ratio of the peripheral circuit to the memory is large, and if the area of the peripheral circuit can be reduced, it is possible to reduce an occupation area of all the memories in the semiconductor integrated circuit device.

For example, by integrating a plurality of memories to a time sharing virtual multi port memory, the area of the peripheral circuit can be reduced. This is because an area of the memory cell arrays is not changed by the integration but the peripheral circuit can be shared by the memory cell arrays.

Since the time sharing virtual multi port memory makes a single port SRAM to operate faster than an external clock, sequentially processes reading or writing request corresponding to a plurality of ports in a time sharing manner during one cycle of an external clock to terminate all requested operations, an effect similar to that simultaneous access is performed to a plurality of independent memories can be obtained when viewed externally.

In a conventional time sharing virtual multi port memory, a clock generating circuit such as a PLL circuit or a delay circuit utilizing an inverter chain is used for a time sharing manner control. However, these clock generating circuit has a large overhead of area and power consumption.

Therefore, an object of the present invention is to provide a technique for reducing an area in a semiconductor integrated circuit device mounted with a time sharing virtual multi port memory or the like.

The above and other object and novel features of the present invention will be apparent from the following description of the text and the accompanying drawings attached thereto.

An outline of a representative one of the inventions disclosed here will be briefly explained below.

That is, a semiconductor integrated circuit device according to the present invention is that, in a memory device comprising a memory cell array including a plurality of memory cells, and a peripheral circuit for controlling the memory cell array, time sharing control is performed by utilizing a signal generated in the memory for controlling an input signal to the memory device and input/output data. Thereby, a time sharing virtual multi port memory with a reduced area which has no need of a clock generating circuit can be realized.

According to the present invention, by accessing a single port memory in a time sharing manner, a multi port memory with a reduced area can be configured.

BRIEF DESCRIPTIONS OF THE DRAWINGS

Figure 25:
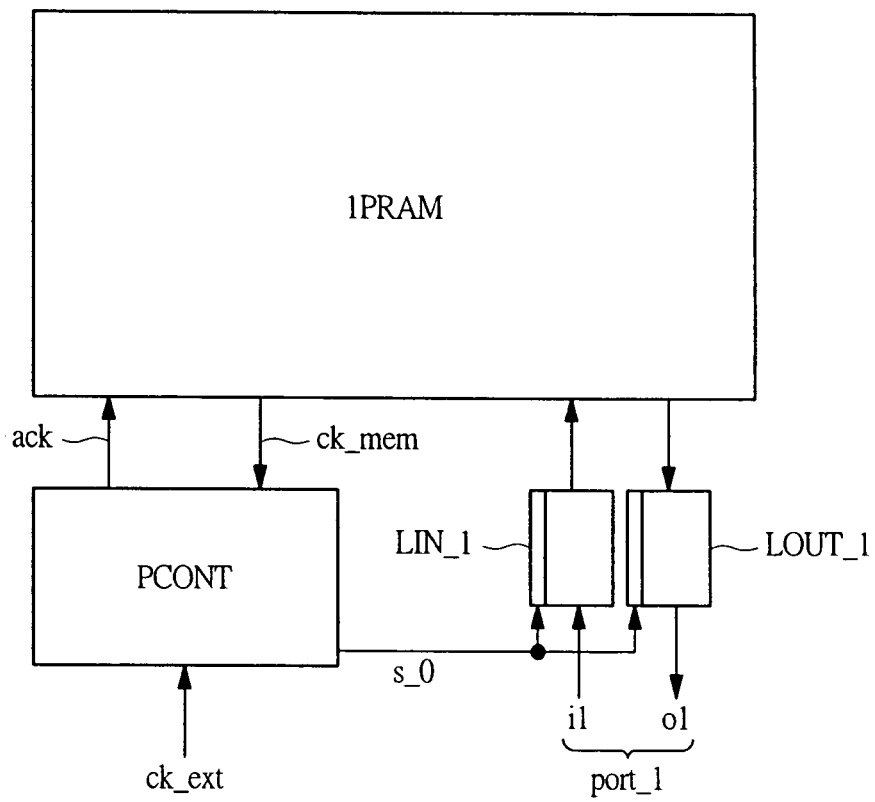
Figure 26:
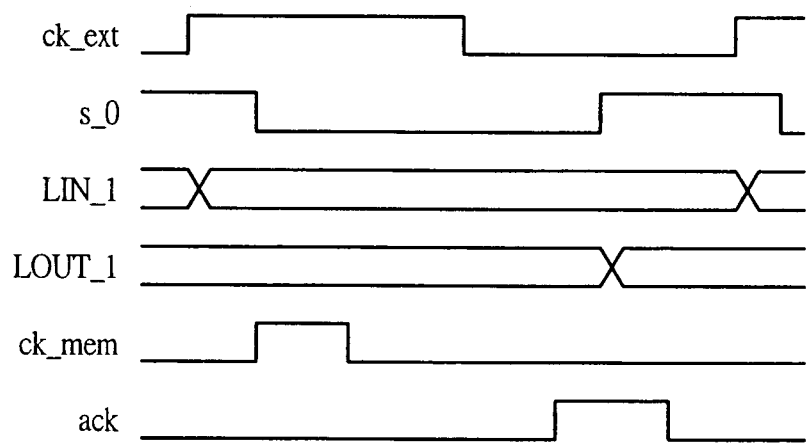

FIG. 25 is a block diagram showing a configuration of a storage device which controls a data output timing to the outside utilizing a signal in an SRAM according to a twelfth embodiment of the present invention; and FIG. 26 is a timing chart showing an operation of the storage device which controls a data output timing to the outside utilizing a signal in an SRAM according to the twelfth embodiment of the present invention.

DESCRIPTIONS OF THE PREFERRED EMBODIMENTS

Embodiments of the present invention will be explained below in detail with reference to the drawings. Note that, in all figures for explaining embodiments, the same members are assigned with same reference symbols, and explanation thereof is omitted.

First Embodiment

Figure 1:
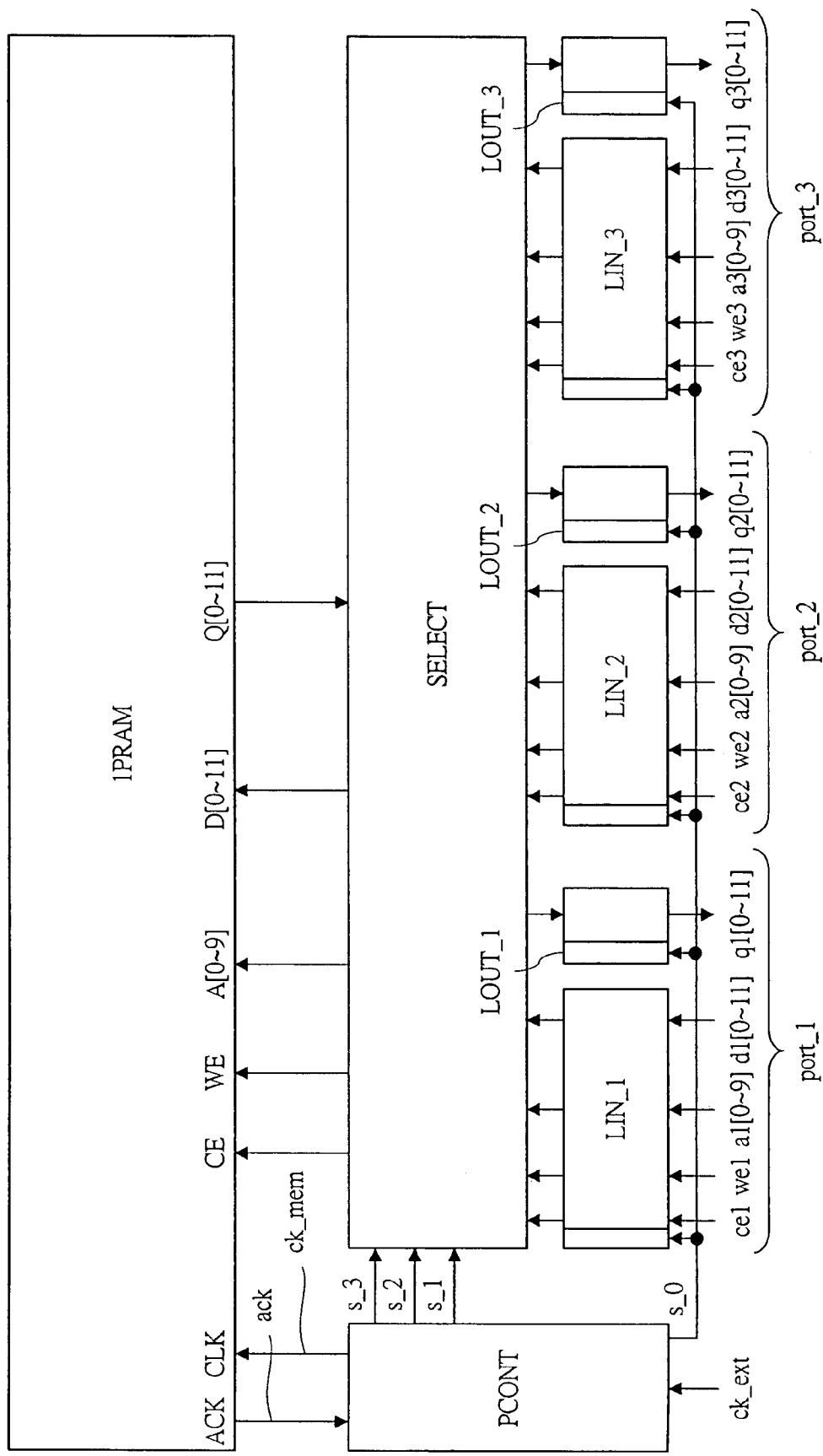
FIG. 1 is a block diagram showing a configuration of a time sharing virtual multi port memory utilizing an internal signal in an SRAM according to a first embodiment of the present invention.

FIG. 1 is a block diagram showing a configuration of a time sharing virtual multi port memory mounted on a semiconductor integrated circuit device according to a first embodiment of the present invention. The semiconductor integrated circuit device according to the first embodiment is formed on a semiconductor substrate by a well-known semiconductor fabrication technique.

Referring to FIG. 1, first, one example of a configuration of a time sharing virtual multi port memory mounted on the semiconductor integrated circuit device according to the first embodiment of the present invention is explained. The time sharing virtual multi port memory is composed of, for example, an internal memory, a time sharing control circuit, and the like. The internal memory is a single port SRAM (1PRAM), for example, including a memory cell array including a plurality of memory cells, a peripheral circuit that controls the memory cell array, and the like. The time sharing control circuit is for controlling an input signal into the internal memory and controlling input/output data between the internal memory and a plurality of ports in a time sharing manner. It is composed of, for example, input data latch circuits LIN_1 to LIN_3, output data latch circuits LOUT_1 to LOUT_3, a selector SELECT, a time sharing control signal generating circuit PCONT, and the like.

A multi port memory operation is realized in a pseudo manner by making the single port SRAM (1PRAM) to operate faster than an external clock signal ck_ext to process sequentially reading or writing requests corresponding to a plurality of ports during one cycle of the external clock in a time sharing manner.

In the first embodiment, the case in which three ports port_1 to port_3 exist, but two, four or more ports can be provided. When two or more ports are provided, similar effect can be achieved by similar circuit configuration.

The single port SRAM (1PRAM) is an SRAM with one port.

The input data latch circuits LIN_1 to LIN_3 are latch circuits for holding input signals such as an address signal, a control signal, or a data signal of each of the ports port_1 to port_3, and a plurality of latch circuits is collectively represented.

The output data latch circuits LOUT_1 to LOUT_3 are latch circuits for holding output signals of each of the ports port_1 to port_3, and a plurality of latch circuits is collectively represented.

The selector SELECT is a selector for switching the connection between the single port SRAM (1PRAM) and the ports port_1 to port_3.

The time sharing control signal generating circuit PCONT is a circuit for generating control signals s_0 to s_3 and ck_mem.

The external clock signal ck_ext is a clock signal externally inputted into the multi port memory according to the first embodiment. The control signal s_0 is a control signal for controlling timing at which the input data latch circuits LIN_1 to LIN_3 or the output data latch circuits LOUT_1 to LOUT_3 hold or output a signal. The control signals s_1 to s_3 are signals for specifying connections between 1PRAM and ports port_1 to port_3, and a port of the ports port_1 to port_3 corresponding to a HIGH-leveled signal is selected by the selector SELECT to be connected to 1PRAM. The control signal ck_mem is an operation starting signal for causing 1PRAM to operate. The signal ack is a signal showing a termination of data reading or writing operation of 1PRAM.

In 1PRAM, ACK is an operation termination signal output terminal of 1PRAM, CLK is a clock signal input terminal of 1PRAM, CE is a chip enable signal input terminal, WE is a writing operation specifying write enable signal input terminal, A [0 to 9] is an address signal input terminal (which shows a case with 10 bits address but it may be arbitrary value), D [0 to 11] is a data input signal terminal (which shows a case with 12 bits but it may be arbitrary value), and Q [0 to 11] is a data output signal terminal (which shows a case with 12 bits but it may be arbitrary value).

To the ports port_1 to port_3, input or output of the input/output signal chip enable signals ce1 to ce3, write enable signals we1 to we3, addressing signals A1 to A3 [0 to 9], input data signals D1 to D3 [0 to 11], and output data signals Q1 to Q3 [0 to 11] is performed respectively. Incidentally, the bit numbers of the addressing signal, the input data signal, and the output data signal are determined arbitrarily.

Before the external clock signal ck_ext rises, the control signal s_0 is asserted, and signals such as an address signal, a control signal, or a writing data are inputted to the respective ports. By rising of the external clock signal ck_ext, the control signal s_1 is asserted, a data at the first port port_1 is selected, and processing to data at the first port port_1 by the 1PRAM starts. When the processing of data at the first port port_1 is terminated, an operation termination signal ack is outputted from 1PRAM, the control signal s_2 is asserted by inputting of the operation termination signal ack, data at the second port port_2 is selected, and processing to data at the second port port_2 by the 1PRAM is starts. Next, when the processing of data at the second port port_2 is terminated, an operation termination signal ack is outputted from 1PRAM, the control signal s_3 is asserted by inputting of the operation termination signal ack, data at the third port port_3 is selected, and processing to data at the third port port_3 by the 1PRAM is starts.

By repeating the processing utilizing the operation termination signals from 1PRAM in this manner, data of respective ports can be sequentially processed without using a clock generating circuit.

Figure 2:
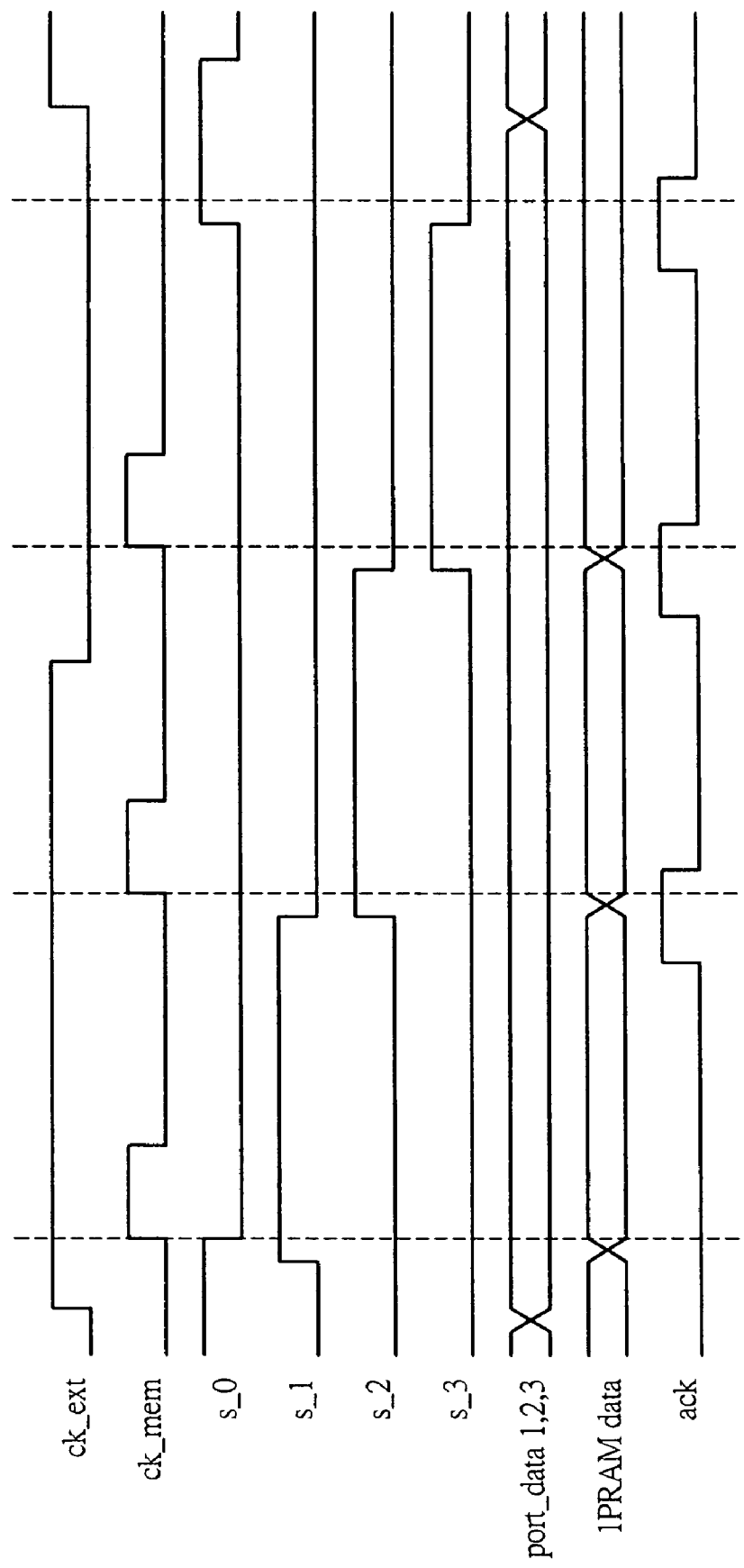
FIG. 2 is a timing chart showing an operation of the time sharing virtual multi port memory utilizing an internal signal in an SRAM according to the first embodiment of the present invention.

FIG. 2 is a timing chart showing an operation of the time sharing virtual multi port memory shown in FIG. 1. As shown in FIG. 2, before the external clock signal ck_ext is inputted, the control signal s_0 is in HIGH state and the control signals s_1 to s_3 are in LOW states. The control signal s_0 is changed to LOW state by rising of the external clock signal ck_ext, and an input signal of each port are held at LIN_1 to LIN_3, respectively. Simultaneously, the control signal s_1 becomes HIGH and data at port_1 is connected to an input/output terminal of 1PRAM.

By rising of the external clock signal ck_ext, a pulse-like control signal ck_mem is generated by PCONT. By input of the control signal ck_mem into 1PRAM, 1PRAM operates so that data at port_1 is processed.

When the processing is terminated, 1PRAM outputs an operation termination signal ack. The ack is inputted to PCONT, and PCONT switches a HIGH-leveled signal line of the selector control signals s_1 to s_3 from s_1 to s_2. Thereby, data at port_1 is connected to 1PRAM.

By input of ack, PCONT generates a pulse-like signal ck_mem, and the ck_mem is inputted to 1PRAM, and 1PRAM processes data at port_2.

Similarly, after the processing of data at port_3 is terminated and processing of data at all ports is terminated, s_0 becomes HIGH. By change of the s_0 to HIGH, the LOUT_1 to LOUT_3 output output data held thereby to the outside.

The time sharing virtual multi port memory is in a stop state until ck_exk is next inputted.

Figure 3:
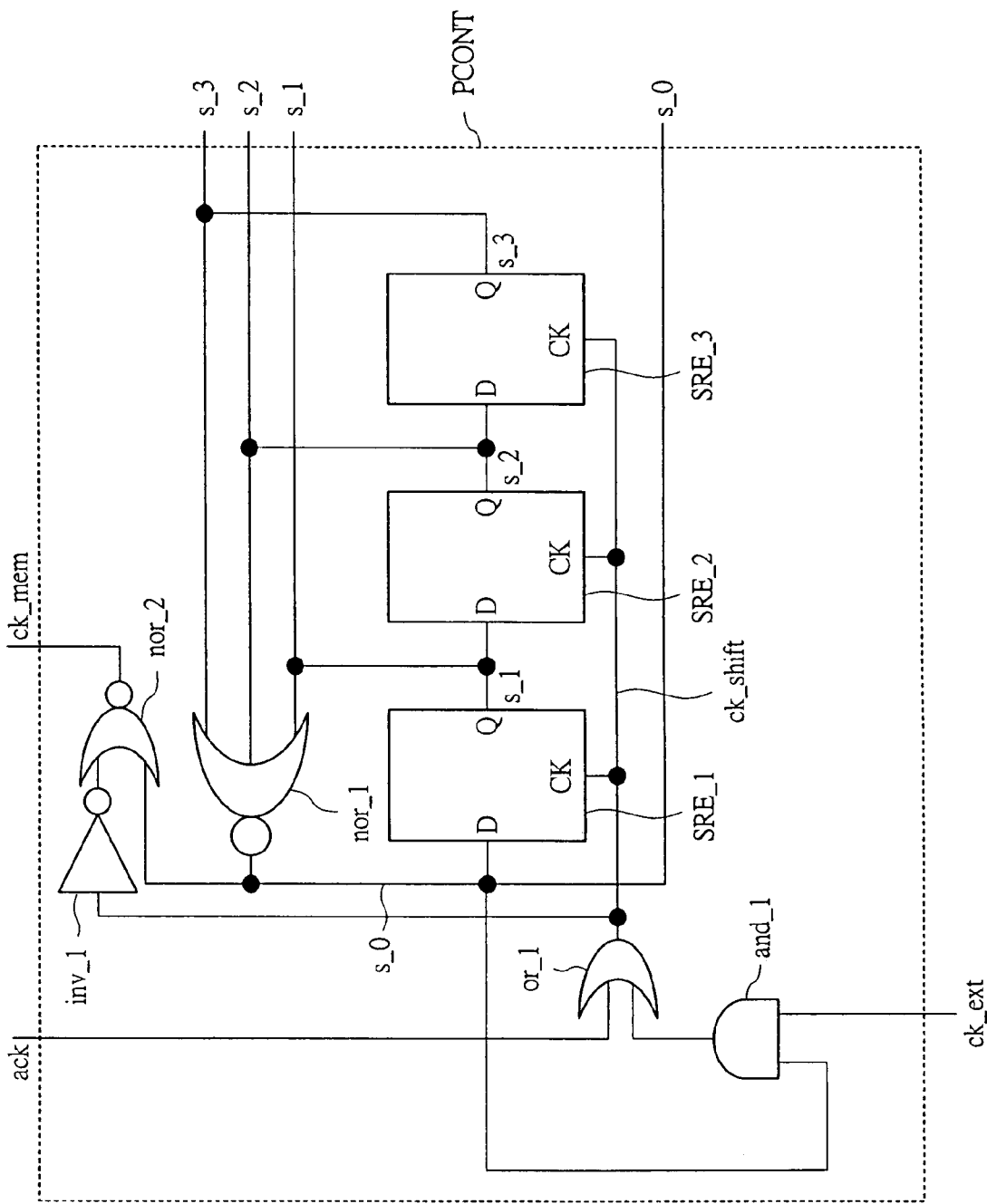
FIG. 3 is a circuit diagram showing a configuration of a time sharing control signal generating circuit PCONT utilizing a shift register according to the first embodiment of the present invention.

FIG. 3 is a diagram showing a circuit configuration of the time sharing control signal generating circuit PCONT. SRE_1, SRE_2, and SRE_3 are shift registers that output a value of an input terminal D to an output terminal Q at a rising edge of an input signal at a terminal CK, and the number of ports of the time sharing virtual multi port memory is equal to the number of shift registers.

Signals ck_shift and ck_mem are generated by rising of input of an external clock signal ck_ext or inputting of an operation termination signal ack from 1PRAM. The signal ck_shift causes the shift registers SRE_1, SRE_2, and SRE_3 to operate so that input values of the respective shift registers are outputted. The signal ck_mem acts as a clock signal that is inputted to 1PRAM to cause 1PRAM to operate. Output signals s_1 to s_3 from the respective shift registers act as switching signals for a selector connecting input/output signals of respective ports and 1PRAM.

An AND circuit and_1 falls a signal produced from ck_ext before the next internal clock is inputted. A NOR circuit nor_1 sets s_0 to HIGH after termination of operations of all the port. A NOR circuit nor_2 suppresses a generation of a control signal ck_mem by an ack signal outputted after termination of the data processing operation at the final port.

Figure 4:
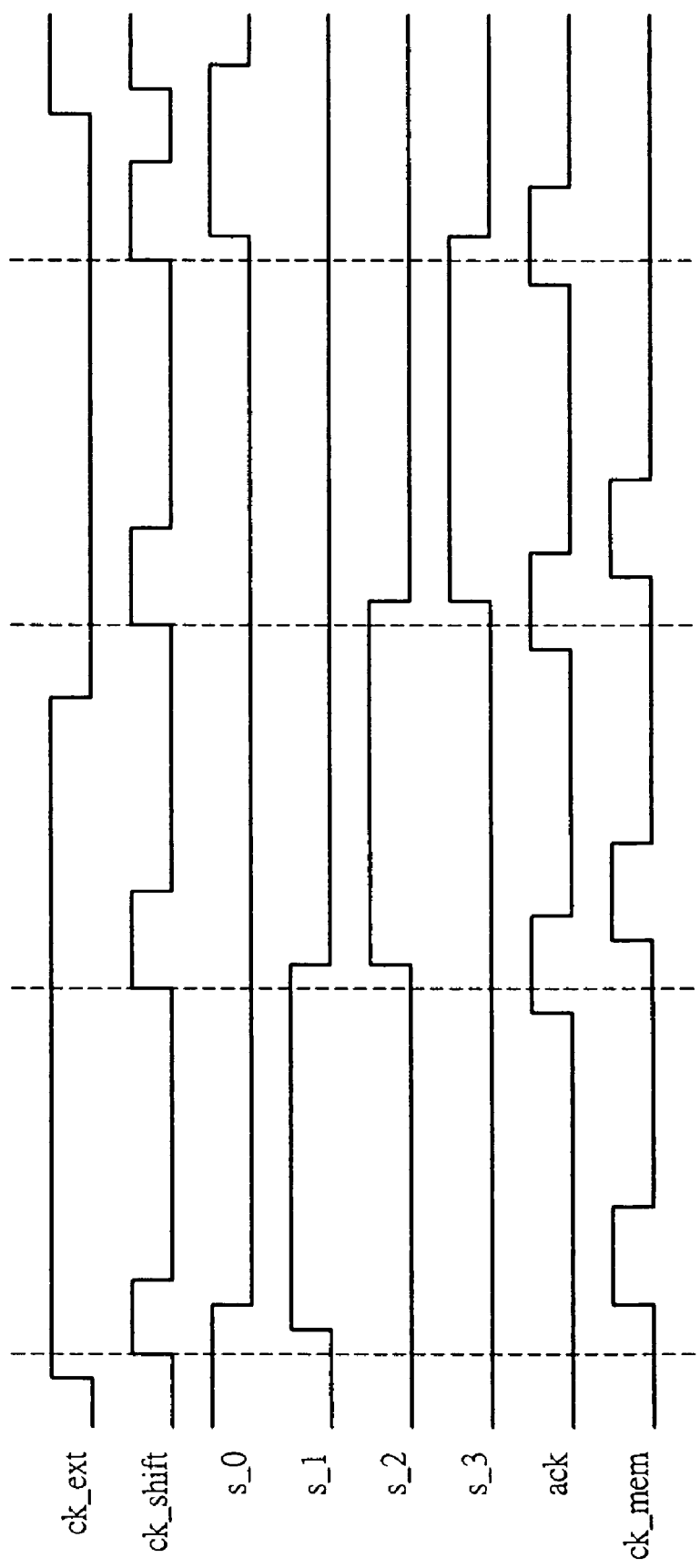
FIG. 4 is a timing chart showing an operation of the time sharing control signal generating circuit PCONT according to the first embodiment of the present invention.

FIG. 4 is a timing chart showing an operation of the time sharing control signal generating circuit PCONT shown in FIG. 3. First, inputting of an external clock signal ck_ext is performed. AND operation between the ck_ext and a signal s_0 is performed so that a signal ck_shift rises.

Thereby, each shift register operates so that s_1 switches from LOW to HIGH. The control signal s_0 changes to LOW due to that the control signal s_1 has switched to HIGH so that a signal ck_mem rises. On the other hand, a signal ck_shift falls due to that the control signal s_0 has changed to LOW, so that the signal ck_mem also falls.

The signal s_1 switches to HIGH, data at port_1 is selected, and a control signal ck_mem for operation start is inputted to 1PRAM, so that the data at port_1 is processed, an operation termination signal ack is outputted from 1PRAM at a termination of the operation.

By inputting of the ack, a ck_shift is produced, the shift register is caused to operate, and a selection port is changed. And, by inputting of the ack, a ck_mem is generated to cause 1PRAM to operate.

When the shift register is operated by the operation termination signal ack of data at port_3, the output signals s_1 to s_3 of all the shift register change to LOW and the s_0 changes to HIGH. Thereby, the signal ck_mem remains LOW even if the ack is inputted, so that the operation is terminated.

Figure 5:
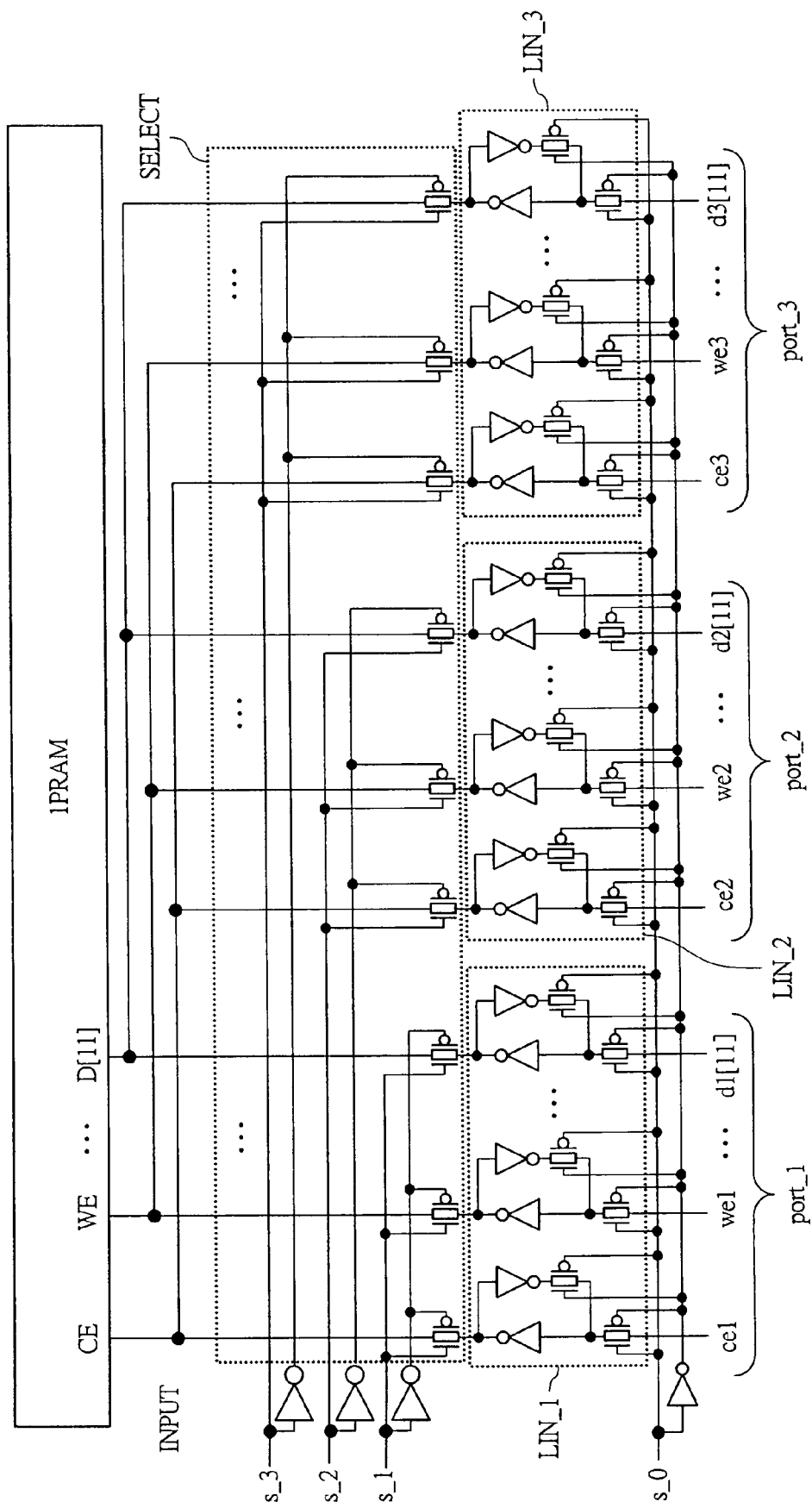
FIG. 5 is a circuit diagram showing a configuration of a latch circuit and a selector circuit for an input signal of the time sharing virtual multi port memory according to the first embodiment of the present invention.

FIG. 5 shows a circuit structure of the input data latch circuits LIN_1 to LIN_3 and the selector SELECT shown in FIG. 1. Note that, in FIG. 5, since circuits corresponding to a1 to a3 [0 to 9], d1 to d3 [0 to 10], A [0 to 9], and D [0 to 10] are the same with the circuits corresponding to ce1 to ce3, we1 to we3, d1 to d3 [11], and the like, they are omitted.

A port to be connected to 1PRAM is selected by a signal of the signals s_1 to s_3 that is in HIGH. When the signal s_0 is in HIGH, signals can be inputted externally, and when the signal s_0 is in LOW, a gate connected externally is closed to be in data holding state.

These input signals include a memory operation/non-operation control signal, writing/reading control signal, an addressing signal, writing data signal, and the like.

Figure 6:
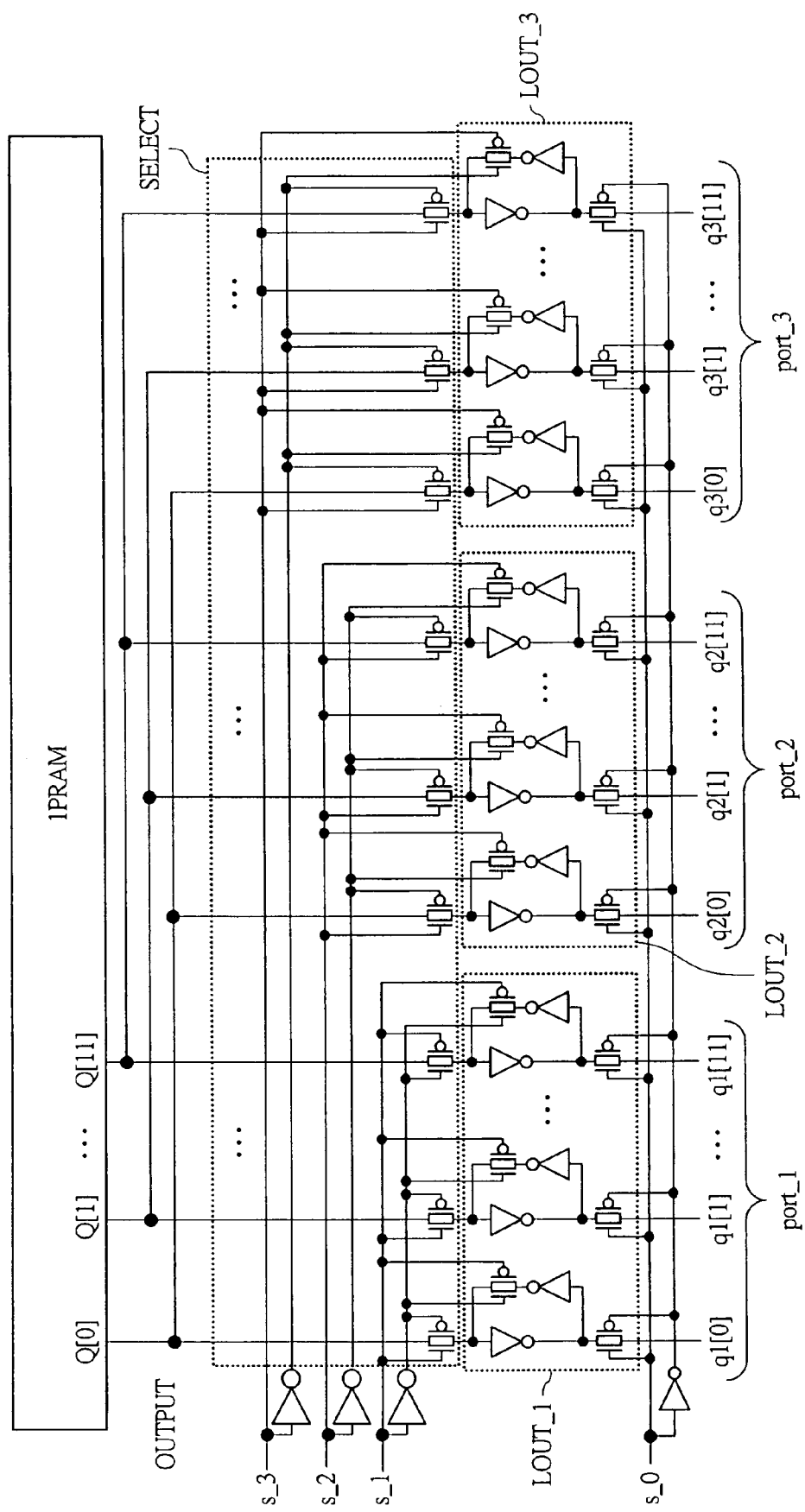
FIG. 6 is a circuit diagram showing a configuration of a latch circuit and a selector circuit for an output signal of the time sharing virtual multi port memory according to the first embodiment of the present invention.

FIG. 6 shows a circuit structure of the output data latch circuits LOUT_1 to LOUT_3 and the selector SELECT shown in FIG. 1. Note that, in FIG. 6, since circuits corresponding to q1 to q3 [2 to 10], and Q [2 to 10] are the same with the circuits corresponding to q1 to q3 [0, 1, 11], Q [0, 1, 11], and the like, they are omitted.

A port to be connected to 1PRAM is selected by a signal of the signals s_1 to s_3 that is in HIGH. A latch part at which data at the selected port is held receives data input from 1PRAM and it is in a holding state at a non-selected state. When the signal s_0 is in HIGH, data is outputted to the outside. The output signals include a reading data signal and the like.

Figure 7:
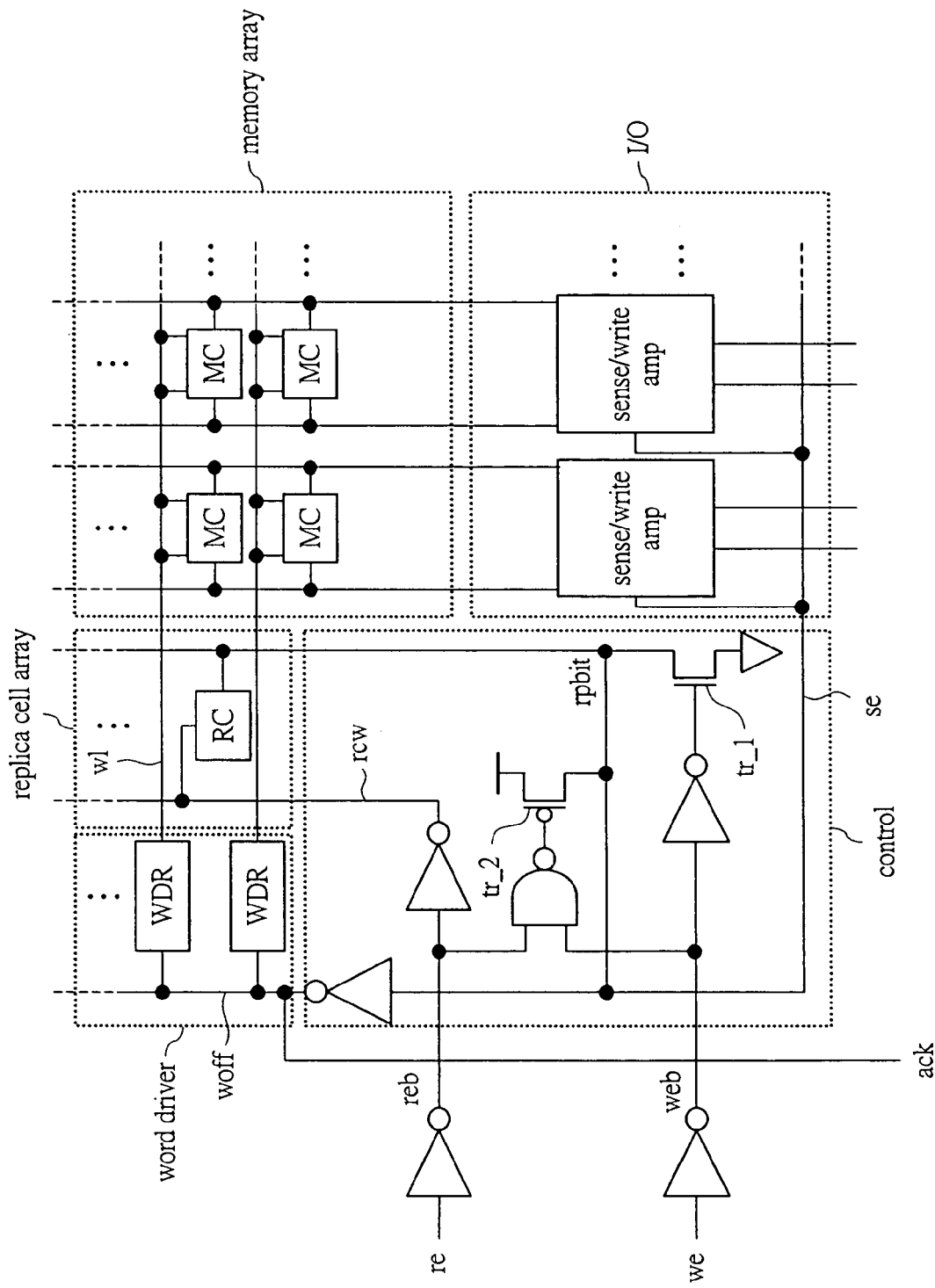
FIG. 7 is a circuit diagram showing a configuration of a word line falling signal generating circuit in the SRAM utilized for time sharing control according to the first embodiment of the present invention.

FIG. 7 shows a structure of a circuit used to generate an ack signal. The circuit shows only a main section in a circuit of 1PRAM.

In an SRAM, a signal for adjusting timing is generally produced therein for operation thereof, and the signal is used for fall of a word line or an operation timing of a sense amplifier. In the embodiment, the circuit shown in FIG. 7 will be explained as one example of generation of a timing signal, but even when timing is generated at a different circuit, similar effect can be obtained by using a similar signal.

For generation of ack signal, the word line falling signal generating circuit within 1PRAM is used. A word line falling signal is also used to generate a sense amplifier operation signal. An operation of falling a word line and an operation of making a sense amplifier to execute differential operation are operations which occur at termination of a processing operation of the memory data and it is suitable for an operation termination signal.

FIG. 7 is a diagram of a circuit section of extracted from 1PRAM that relates to a word line falling signal generation. A memory cell array is a section where memory cells are regularly arranged and which store data. An I/O is a section including circuits such as a write amplifier, a read amplifier, and a buffer. A replica cell array is a section where replica cells for producing a word line falling signal and a sense amplifier operation signal in a timely manner are arranged. A word driver is a section for driving a word line. A control is a section for producing a word line falling signal and a sense amplifier operation signal.

MC is an SRAM memory cell, RC is a replica cell having the same structure as the memory cell, and WDR is a word line driver. Signals re and we are read enable signal and word enable signal, respectively. As an operation principle, when the signals we and re are in LOW and reversed signals web and reb of the signals we and re are in HIGH, a PMOS transistor tr_2 is in ON, and a signal line rpbit is in HIGH.

When the signal we or re is turned to HIGH, the PMOS transistor tr_2 is turned to OFF. When the signal we is in HIGH, an NMOS transistor tr_1 is turned to ON and charges in the rpbit are withdrawn. When the signal re is in HIGH, a word line rcw of the replica cell RC is turned to HIGH, and charges in the rpbit is withdrawn through inside of the RC.

By reproducing the same condition as that of the withdrawal of charges from a bit line of the actual memory cell using the replica cell, timing of termination of data reading or data writing to an actual memory cell can be obtained from a time required for withdrawal of charges from the rpbit, it can be used as the word line falling signal.

Figure 8:
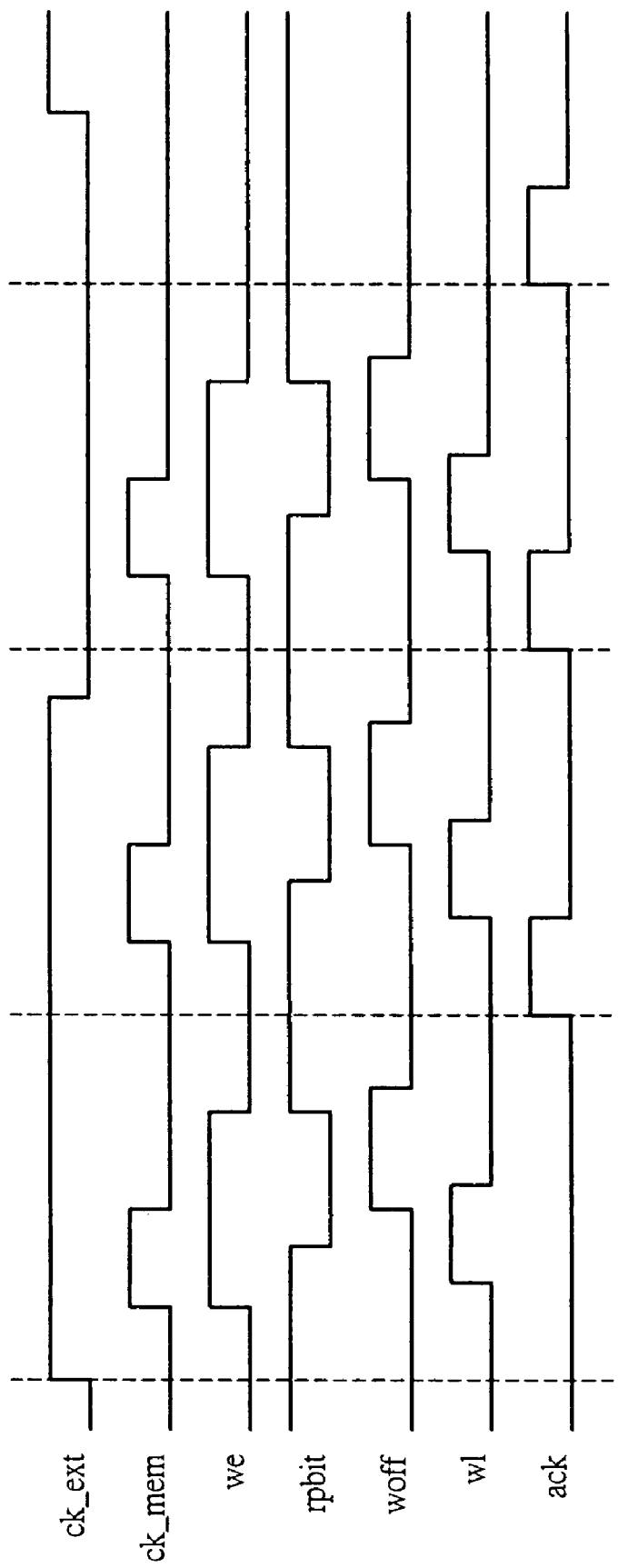
FIG. 8 is a timing chart showing an operation of a word line falling signal generating circuit in the SRAM according to the first embodiment of the present invention.

FIG. 8 is a timing chart showing an operation of the word line falling signal (ack signal) generating circuit. A state at a write operation is shown here. When a signal ck_mem is inputted into 1PRAM, a we signal is turned to HIGH. A word line wl rises according to input of the signal ck_mem. Withdrawal of charges in the rpbit starts, here, it takes a time equivalent to completion of the write operation to a memory cell. A woff signal is turned to HIGH according to turning of the rpbit to LOW, and the word line wl falls. By using the woff signal as the ack signal, an operation termination signal of the memory cell can be outputted at a proper timing.

As described above, by using the first embodiment, timing for time sharing control can be obtained using an internal control signal in the single port memory 1PRAM, and a time sharing virtual multi port memory can be realized with a small area and at a reduced power consumption requiring no additional clock generating circuit that is required for a conventional time sharing virtual multi port memory.

Second Embodiment

A second embodiment of the present invention has a configuration that the circuit configuration of the time sharing control signal generating circuit PCONT has been changed in the time sharing virtual multi port memory according to the first embodiment shown in FIG. 1.

Figure 9:
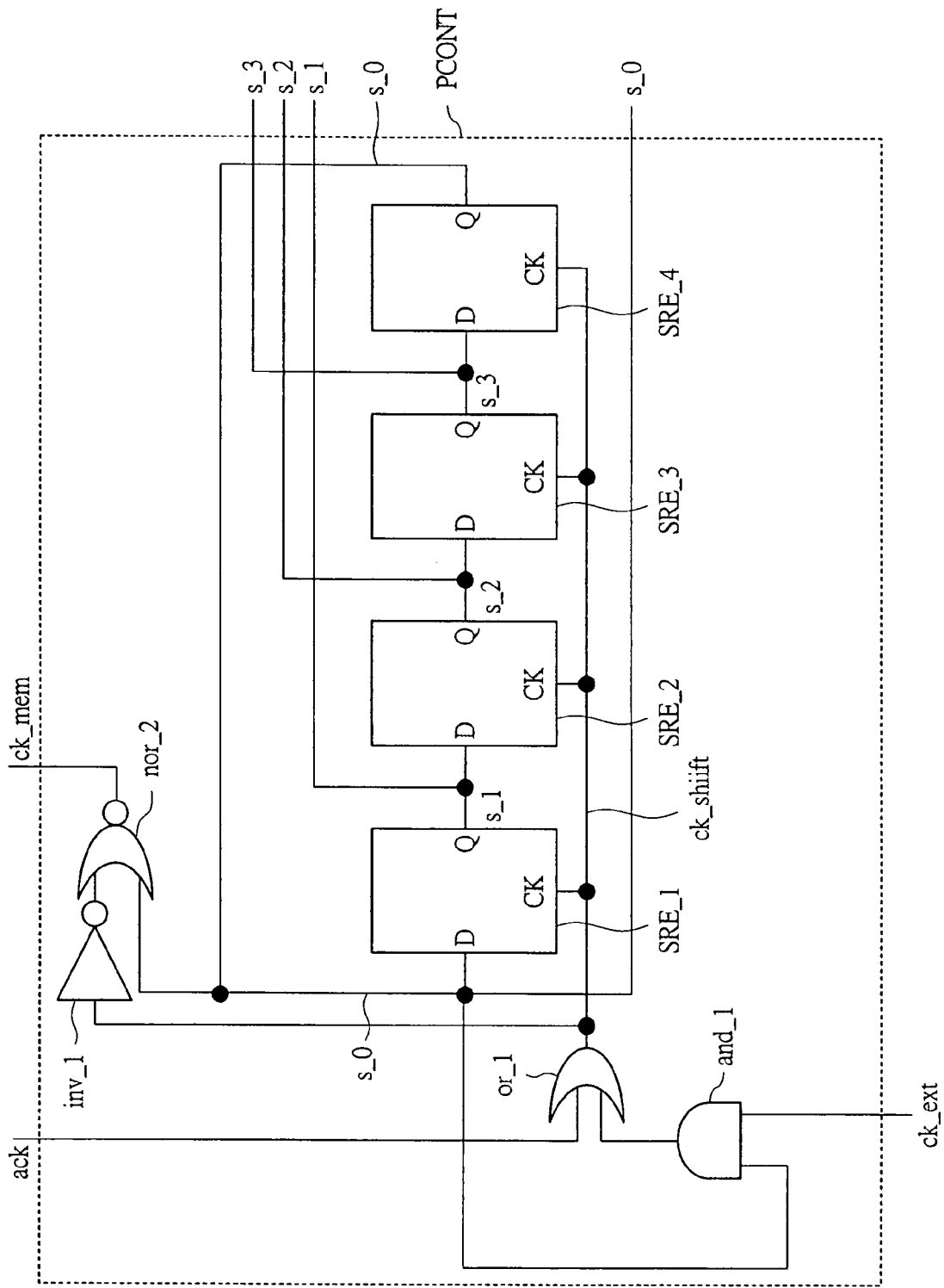
FIG. 9 is a circuit diagram showing a configuration of a time sharing control signal generating circuit PCONT utilizing a ring counter according to a second embodiment of the present invention.

FIG. 9 shows a configuration of a time sharing control signal generating circuit PCONT according to the second embodiment of the present invention. The circuit is a circuit realizing an operation of a time sharing virtual multi port memory. A multi port memory operation is realized in a pseudo manner by causing a single port SRAM 1PRAM to operate faster than an external clock to sequentially process read or write requests from a plurality of ports during one cycle of the external clock in a time sharing manner.

The second embodiment has a configuration in which a ring counter is used instead of the shift register in the time sharing control signal generating circuit PCONT according to the first embodiment, and it has the same configuration as the first embodiment except for PCONT. A difference from the first embodiment lies in that the number of shift registers SRE_1 to SRE_4 is 4, the number of ports plus one.

That is, if the number of ports is an arbitrary number N, the number of shift registers is N+1. After processing of data at the N-th port has been terminated, the shift register operates according to an operation termination signal from 1PRAM, an output of a shift register whose output is s_0 is turned to HIGH, and after processing of data at all the ports is terminated, a value of s_0 can be set to HIGH. By adopting such a circuit structure, the nor_1 in the first embodiment (FIG. 3) is made unnecessary.

Accordingly, by using the second embodiment, a time sharing virtual multi port memory with a reduced area that and a reduced power consumption can be realized and even if the number of inputs into the nor_1 is increased due to increase in number of ports, nothing other than adding one shift register is required, and a time sharing virtual multi port memory with high-speed operation can be realized.

Third Embodiment

In a third embodiment of the present invention, one example of a memory addressing method different from that of the first embodiment is shown.

Figure 10:
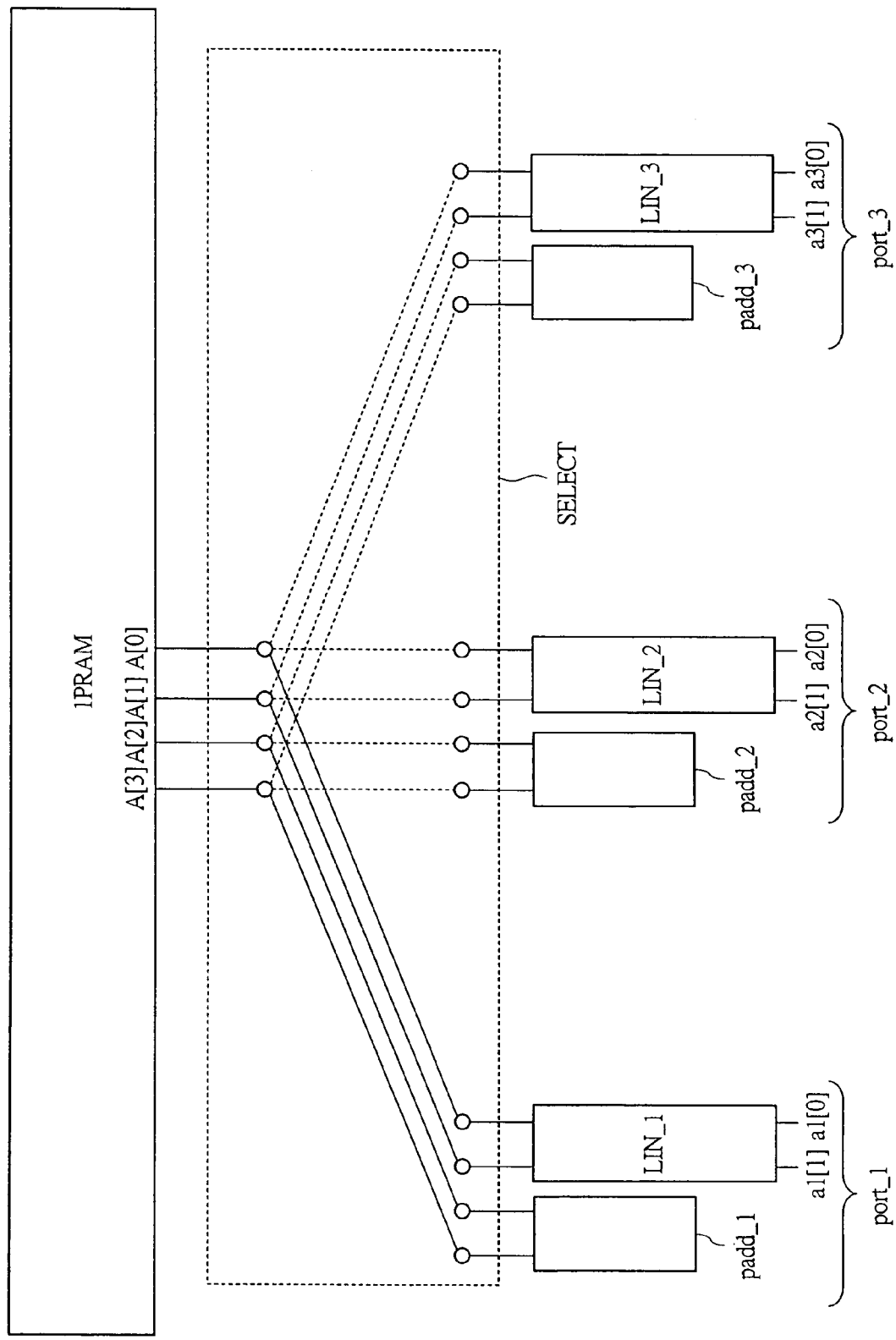
FIG. 10 is a conceptual diagram showing a configuration of a time sharing virtual multi port memory in which a part of an input address signal is fixed at each port according to a third embodiment of the present invention.

FIG. 10 is a conceptual diagram showing a time sharing virtual multi port memory in which some of input address signals are fixed in the respective ports. In FIG. 10, padd_1 to padd_3 are fixed address generating circuits in respective port. In FIG. 10, a case that an address of 1PRAM is 4 bits, an addressing signal of each port is 2 bits, and the remaining 2 bits are generated at the fixed address generating circuit padd_1 to padd_3 at each port is shown as one example. Note that, the number of bits for address is not limited to the above and it may be any number of bits.

As shown in FIG. 10, by fixing several bits in the address of 1PRAM at each port by the fixed address generating circuits padd_1 to padd_3, the memory that each port can access can be limited. Therefore, handling can be conducted as if a plurality of independent memories exists.

Figure 11:
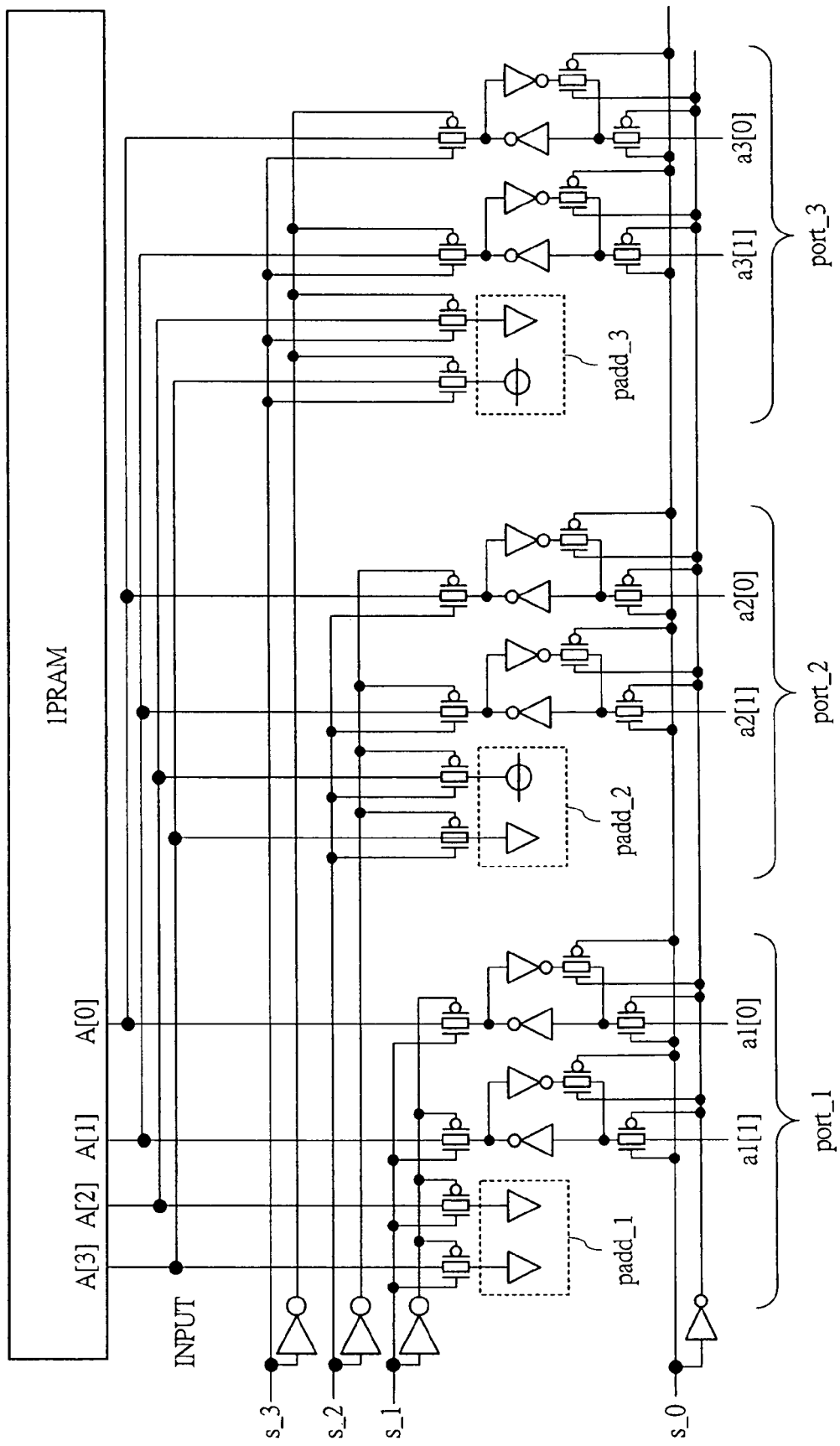
FIG. 11 is a circuit diagram showing a detail configuration of a latch section of the time sharing virtual multi port memory in which a part of an input address signal is fixed at each port according to the third embodiment of the present invention.

FIG. 11 shows a specific circuit example of the fixed address generating circuits padd_1 to padd_3. Each of padd_1 to padd_3 is internally fixed to HIGH or LOW such that 2 bits of the addressing signal takes a value inherent to each port. By adopting such a configuration, the memory that each port can access can be limited. And, handling can be conducted as if a plurality of independent memories exists, and can be used without changing signal lines of an external module and configuration of and the memory used as 1PRAM.

Fourth Embodiment

A fourth embodiment of the present invention has a configuration that the circuit configuration of the time sharing control signal generating circuit PCONT has been changed in the time sharing virtual multi port memory according to the first embodiment shown in FIG. 1.

Figure 12:
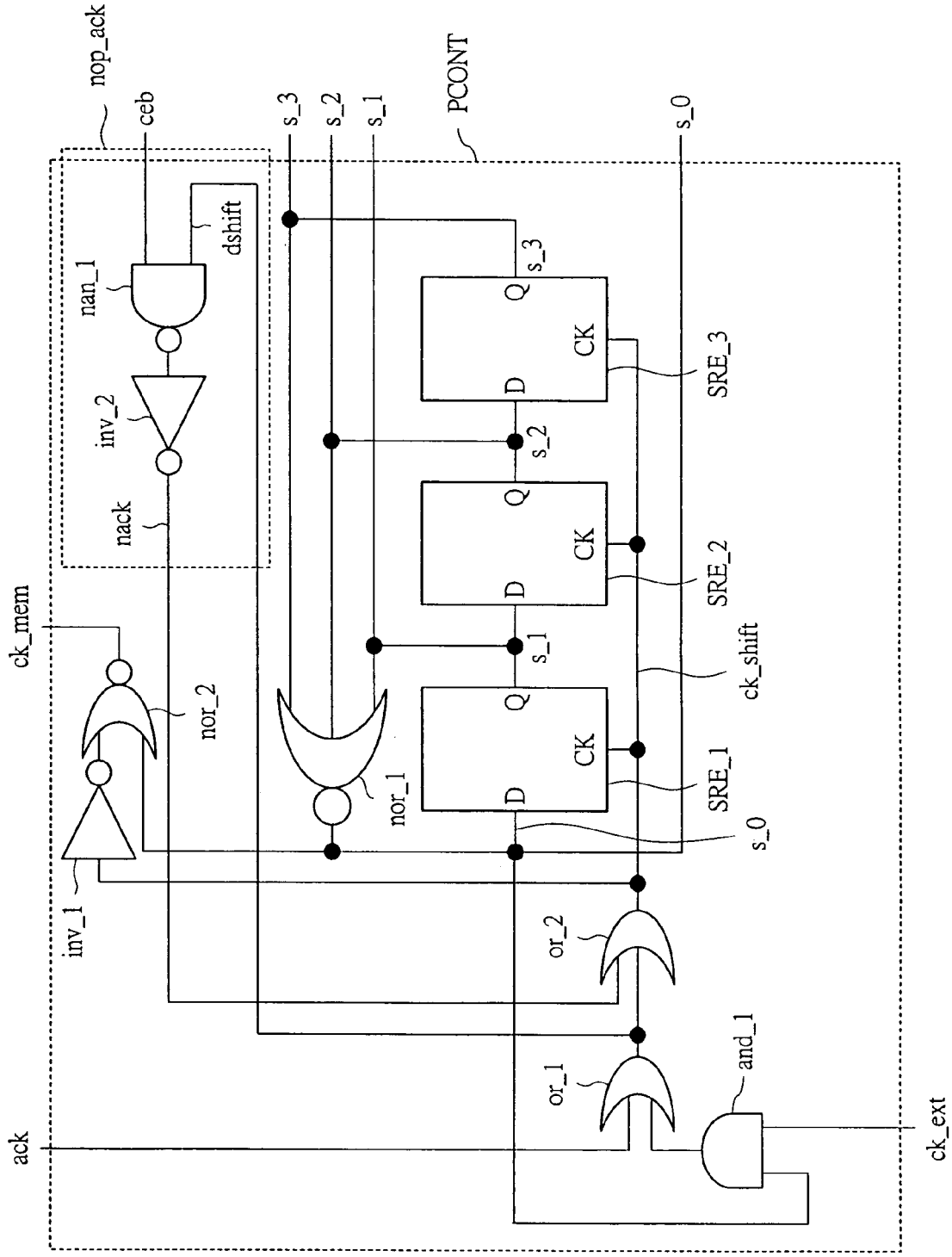
FIG. 12 is a circuit diagram showing a configuration of a time sharing control signal generating circuit PCONT added with a circuit that transfers a processing to another port when writing and reading operations are not required according to a fourth embodiment of the present invention.

FIG. 12 shows a configuration of a time sharing control signal generating circuit PCONT according to the fourth embodiment.

In a case where 1PRAM includes an external input signal terminal for controlling operation/non-operation, such an event may occur that, when a signal for selecting non-operation is inputted at a port, an internal control signal of 1PRAM is not outputted and an operation is terminated at the port. In order to avoid such an event, such a circuit is required that, when a signal for selecting non-operation is inputted at a port, connection with 1PRAM is switched to the next port to continue an operation of data processing. A circuit satisfying the request is a circuit shown in FIG. 12.

As shown in FIG. 12, the fourth embodiment has a configuration that circuits (nop_ack, or_2) that generates a signal to replace an ack signal when a non-operation selecting signal of 1PRAM is inputted from a port is added to PCONT according to the first embodiment (FIG. 3). The circuit configuration of the present embodiment except for PCONT is similar to that of the first embodiment.

A signal ceb inputted into the circuit nop_ack is a reversed signal of a chip enable signal inputted from outside of a chip. The chip enable signal is a signal that controls operation/non-operation when an operation start signal is inputted to 1PRAM, and the signal is HIGH when 1PRAM is caused to operate while it is LOW when 1PRAM is not caused to operate. A signal dshift is a signal obtained by delaying a signal ck_shift.

Figure 13:
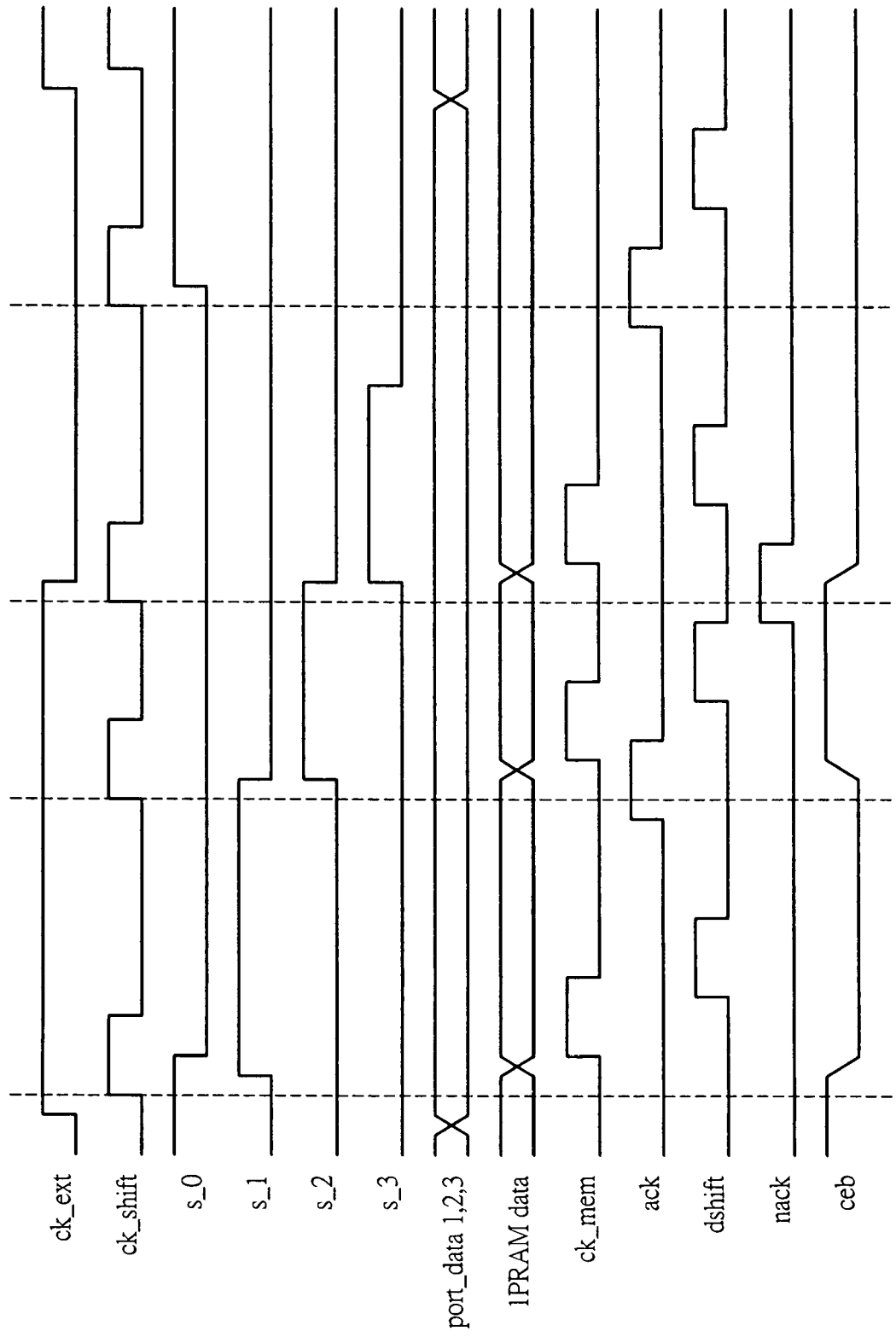
FIG. 13 is a timing chart showing an operation of a time sharing control signal generating circuit PCONT added with a circuit that transfers a processing to another port when writing and reading operations are not required according to the fourth embodiment of the present invention.

FIG. 13 is an operation timing chart of the time sharing control signal generating circuit PCONT shown in FIG. 12. The timing chart shown in FIG. 13 shows a case that the number of ports is 3 and the chip enable signal at port_2 is LOW, namely, an operation of 1PRAM is not requested.

First, after an operation requested from port_1 is terminated, 1PRAM outputs an operation termination signal ack, signal ck_shift, switching between selected ports connecting to 1PRAM occurs, change to a state that port_2 has been selected is executed by assertion to s_2, and a ck_mem is inputted into 1PRAM.

However, since the chip enable signal at port_2 is LOW, 1PRAM does not operate so that an ack signal is not issued.

On the other hand, a signal dshift obtained by delaying the ck_shift is inputted into nan_1, and a signal nack rises to HIGH because one input ceb of the nan_1 is 1, so that the shift registers SRE_1 to SRE_3 are caused to operate, a ck_mem signal is generated, and the next operation is executed.

Accordingly, by the time sharing control signal generating circuit PCONT shown in FIG. 12, an operation of 1PRAM is made possible even if a plurality of ports includes ports which request no operation.

Fifth Embodiment

A fifth embodiment of the present invention has a configuration that a signal different from that in the first embodiment (FIG. 1) is used as a holding data output signal of output data latch circuits LOUT_1 to LOUT_3. In the fifth embodiment, an external clock signal is used as a data output control signal to the outside.

Figure 14:
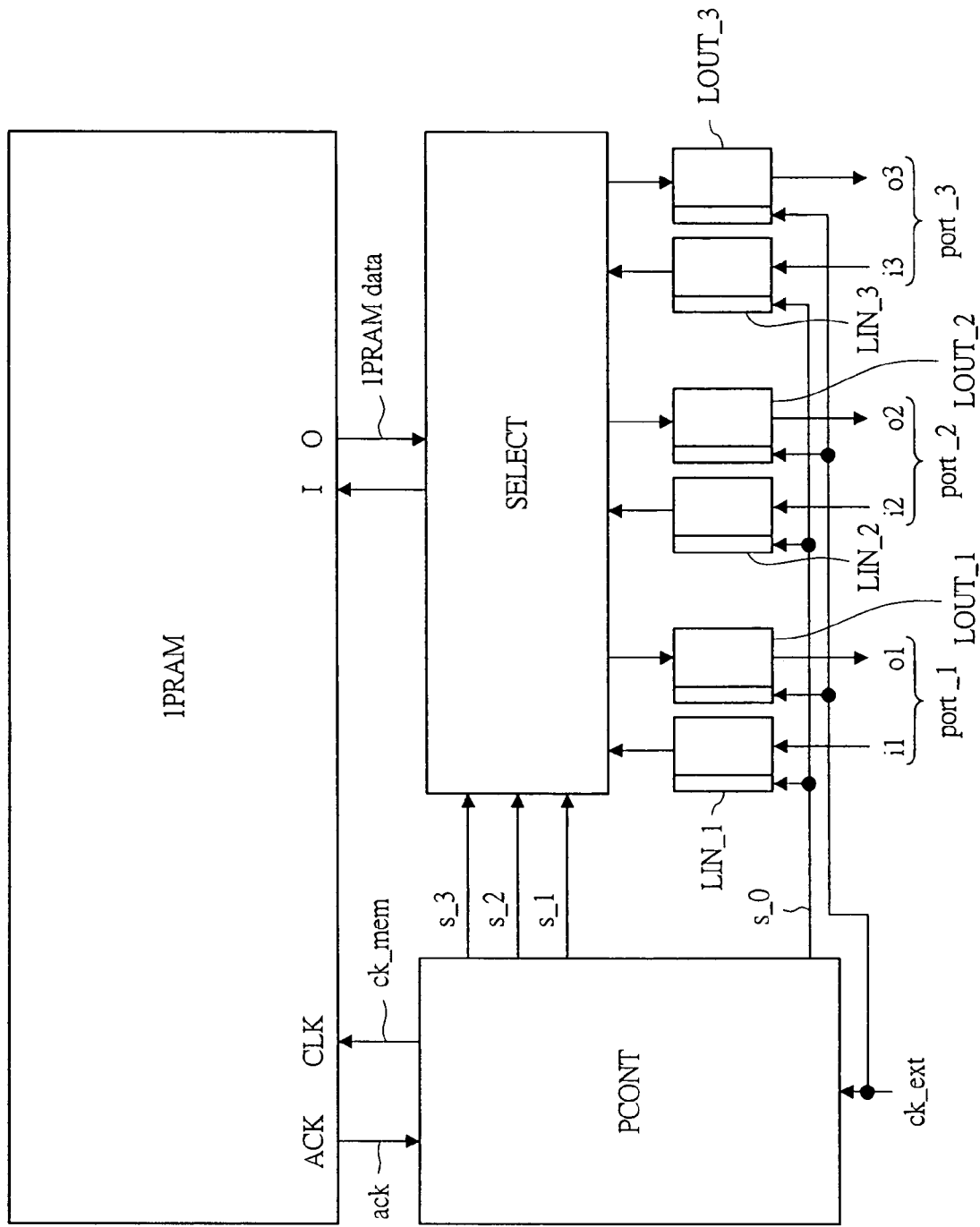
FIG. 14 is a block diagram showing a configuration of a time sharing virtual multi port memory using an external clock as a data output control signal to the outside according to a fifth embodiment of the present invention.

FIG. 14 shows a configuration of a time sharing virtual multi port memory according to the fifth embodiment. The configuration of this embodiment except for the input data latch circuits LIN_1 to LIN_3 and the output data latch circuits LOUT_1 to LOUT_3 is similar to that of the first embodiment (FIG. 1). Note that, in FIG. 14, i1 to i3 correspond to ce1 to ce3, we1 to we3, a1 to a3 [0 to 9], and d1 to d3 [0 to 11], o1 to o3 correspond to q1 to q3 [0 to 11], I corresponds to CE, WE, A [0 to 9], and D[0 to 11], and O corresponds to Q [0 to 11].

The first embodiment has a configuration that data is outputted during rising of a signal s_0 which is an output signal from the nor_1 shown in FIG. 3, on the other hand, the fifth embodiment has a configuration that data is outputted during rising of an external clock signal ck_ext.

Although FIG. 14 shows a case in which the number of ports is 3, it is not limited to 3. As shown in FIG. 14, an external clock signal ck_ext is inputted to the output data latch circuits LOUT_1 to LOUT_3 for output data of the respective output ports. As for a timing chart, the control signal s_0 in FIG. 4 is replaced by the signal ck_ext. The input signal s_0 into LIN_1 to LIN_3 can be replaced by ck_ext.

Therefore, according to the fifth embodiment, it is possible to optimize timings of data input and output to the latches according to timing design of an external module.

Sixth Embodiment

A sixth embodiment of the present invention has a configuration that the configurations of the ack signal generating circuit (FIG. 7) and PCONT (FIG. 3) have been changed in the first embodiment. The other circuit configuration of this embodiment is the same as the first embodiment.

Figure 15:
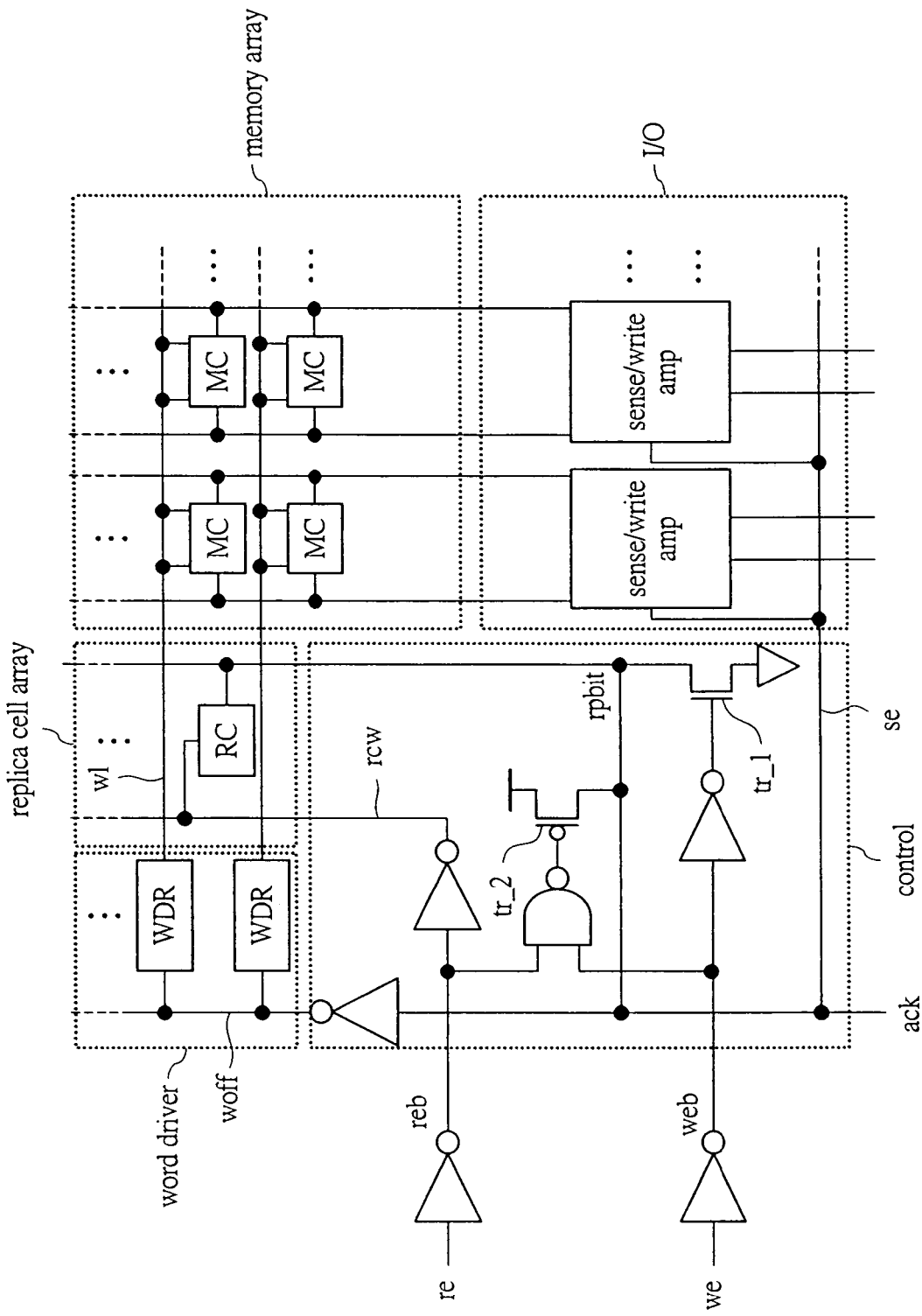
FIG. 15 is a circuit diagram showing a configuration of a word line falling signal generating circuit in an SRAM utilizing a replica bit line as an ack signal according to a sixth embodiment of the present invention.

FIG. 15 shows a configuration of an ack signal generating circuit in the time sharing virtual multi port memory according to the sixth embodiment. As shown in FIG. 15, a signal taken out as the ack signal is different from that in the first embodiment, and rpbit signal is taken out to the outside as the ack signal.

Figure 16:
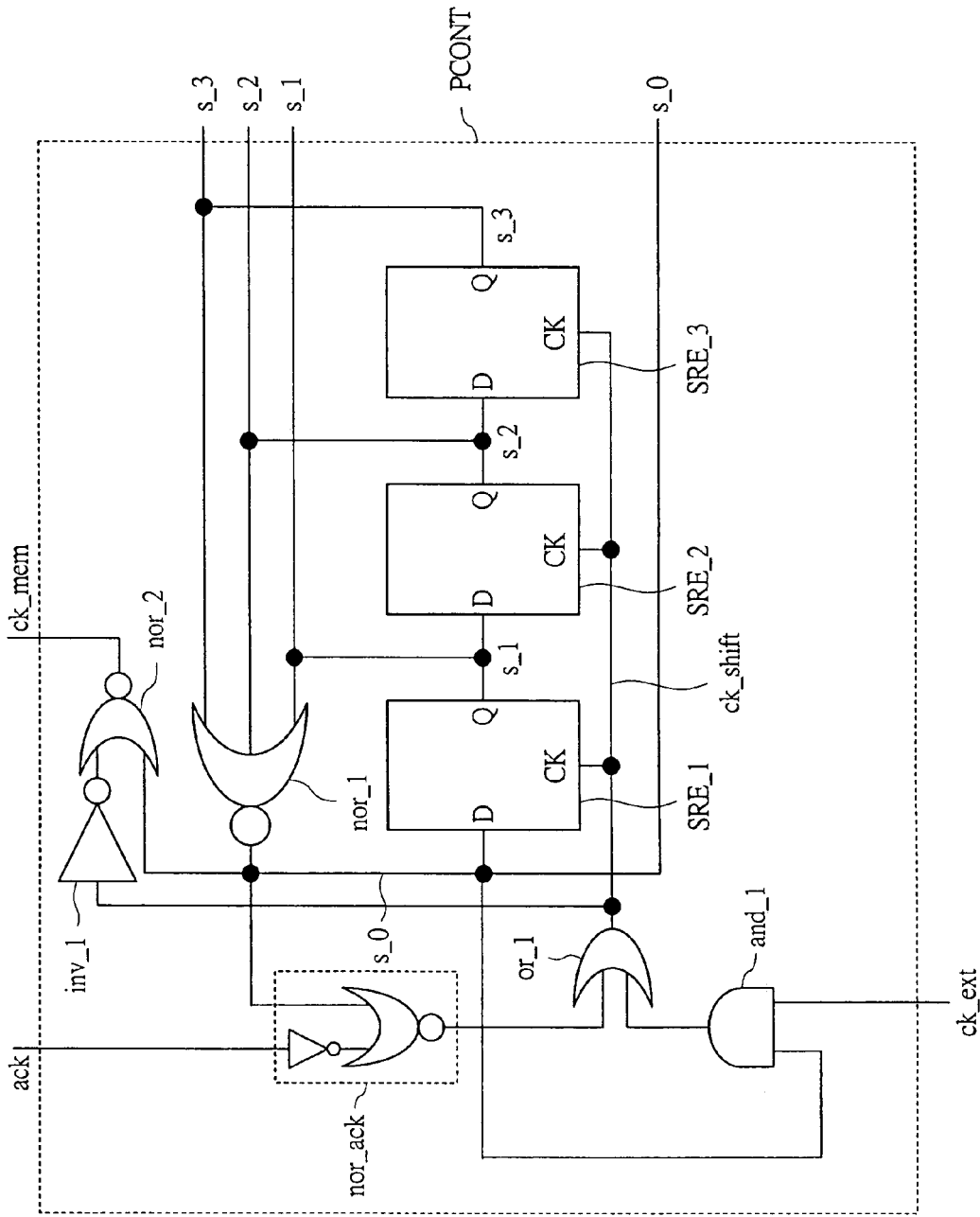
FIG. 16 is a circuit diagram showing a configuration of a time sharing control signal generating circuit PCONT of a time sharing virtual multi port memory utilizing a replica bit line as an ack signal according to the sixth embodiment of the present invention.

FIG. 16 shows a configuration of a PCONT circuit in a time sharing virtual multi port memory according to the sixth embodiment. As shown in FIG. 16, the PCONT according to the sixth embodiment has a configuration that a circuit nor_ack shown by a dotted line is added to the PCONT of the first embodiment (FIG. 3). The nor_ack is provided for preventing such an event that, after a processing at a final port is terminated, when the next external clock signal ck_ext is inputted to cause a signal ck_shift to rise, the signal ck_shift is kept rising so that the shift registers can not be caused to operate.

A write operation has been terminated at a rising of a woff signal, but since amplification of a signal is performed by a sense amplifier in a read operation, the read operation may not be terminated. Since a processing at the read operation and the write operation has been terminated at a time when a signal rpbit which has once fallen rises, it is more suitable as operation termination signal.

Note that, it is necessary to add a nor_ack circuit. If 1PRAM has such a structure that, after a processing at a final port is terminated, a signal rpbit falls before the next external clock ck_ext is inputted, the nor_ack circuit is not required.

Figure 17:
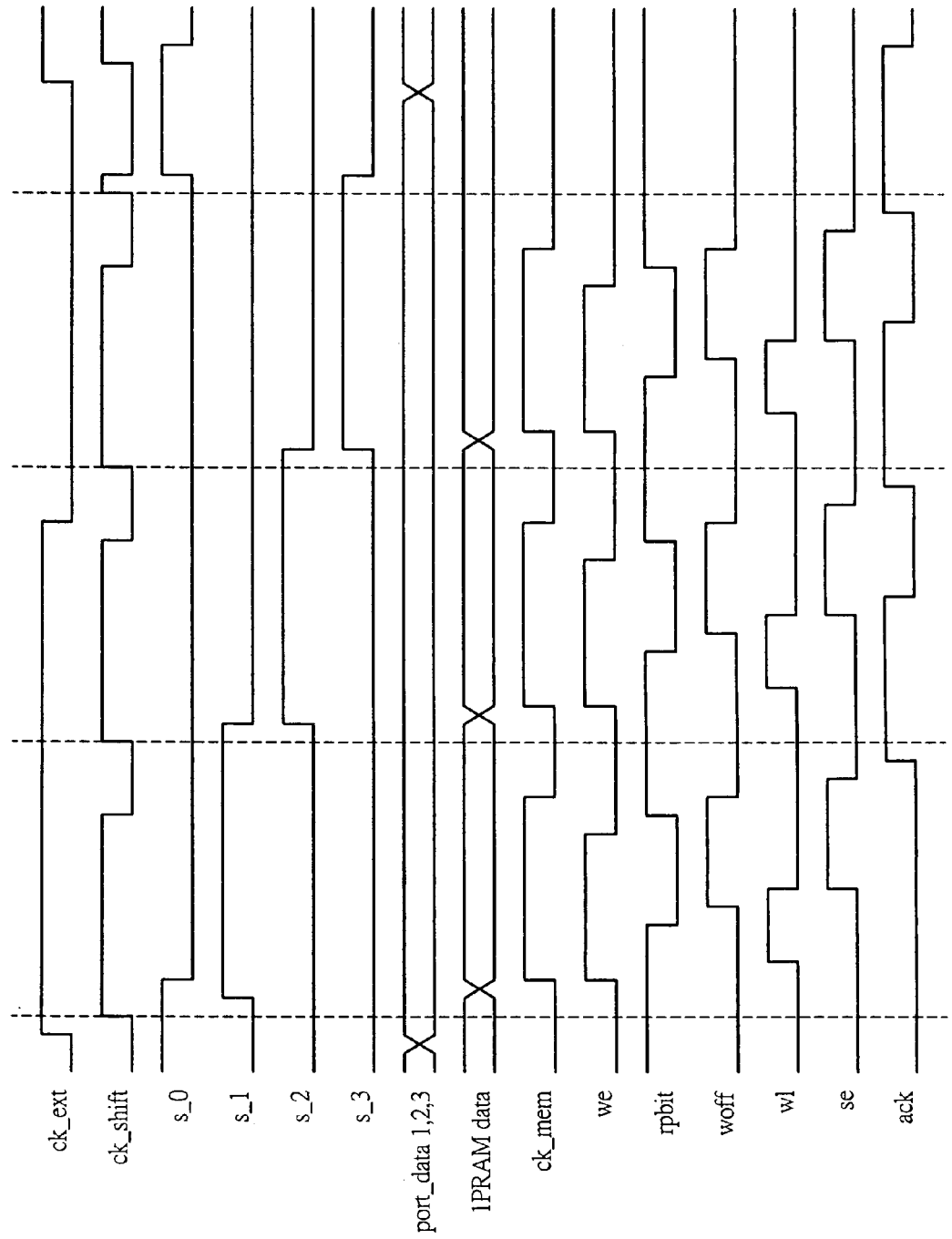
FIG. 17 is a timing chart showing an operation of the time sharing control signal generating circuit PCONT of a time sharing virtual multi port memory utilizing a replica bit line as an ack signal according to the sixth embodiment of the present invention.

FIG. 17 is a timing chart showing an operation of the time sharing virtual multi port memory according to the sixth embodiment of the present invention. As shown in FIG. 17, after data processings at ports are sequentially performed and data processings at all the ports are terminated, a signal s_0 becomes HIGH, the signal ck_shift is caused to fall, and the signal ck_shift rises due to input of the next external clock signal ck_ext to cause the shift registers SRE_1 to SRE_3 to operate.

Since a rising operation of the rpbit is performed at a timing at which all operations of a read operation and a write operation have been terminated, a timing design can be facilitated by using the rpbit signal as an ack signal.

Seventh Embodiment

A seventh embodiment of the present invention has a configuration that a delay circuit for timing adjustment of an ack signal is added to PCONT (FIG. 3) of the first embodiment. The configuration of this embodiment except for PCONT is the same as that of the circuit of the first embodiment.

Figure 18:
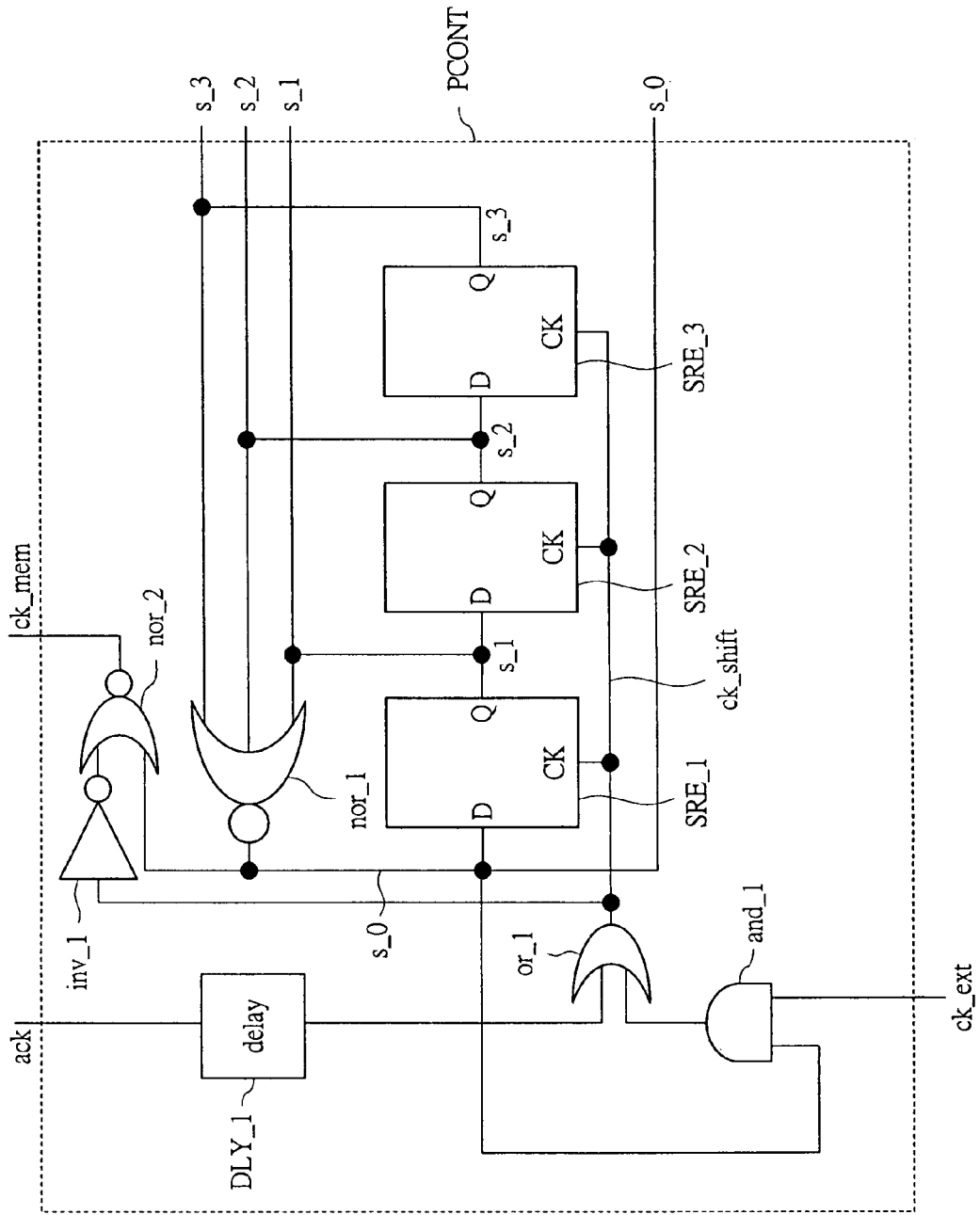
FIG. 18 is a circuit diagram showing a configuration of a time sharing control signal generating circuit PCONT added with a delay circuit for adjusting timings at which an ack signal generates ck_shift and ck_mem according to a seventh embodiment of the present invention.

FIG. 18 shows a circuit configuration of PCONT according to the seventh embodiment of the present invention. As shown in FIG. 18, the seventh embodiment has a configuration that a delay circuit DLY_1 is added to PCONT of the first embodiment (FIG. 3).

By adopting such a circuit configuration, timings of generating ck_shift and ck_mem can be adjusted by delay of an ack signal outputted from 1PRAM at the delay circuit DLY_1.

Eighth Embodiment

An eighth embodiment of the present invention has a configuration that a circuit that can select delay for timing adjustment of an ack signal in a read operation and in a write operation is added to PCONT (FIG. 3) of the first embodiment. The configuration in this embodiment except for PCONT is the same as that of the first embodiment.

The reason for using different delays in the write operation and in the read operation, respectively, is that for further optimizing a timing of producing an operation termination signal, since the write operation and the read operation are different in time until falling of a word line and they are different in time elapsing by an operation termination because the time of read operation includes an operation time for the sense amplifier.

Figure 19:
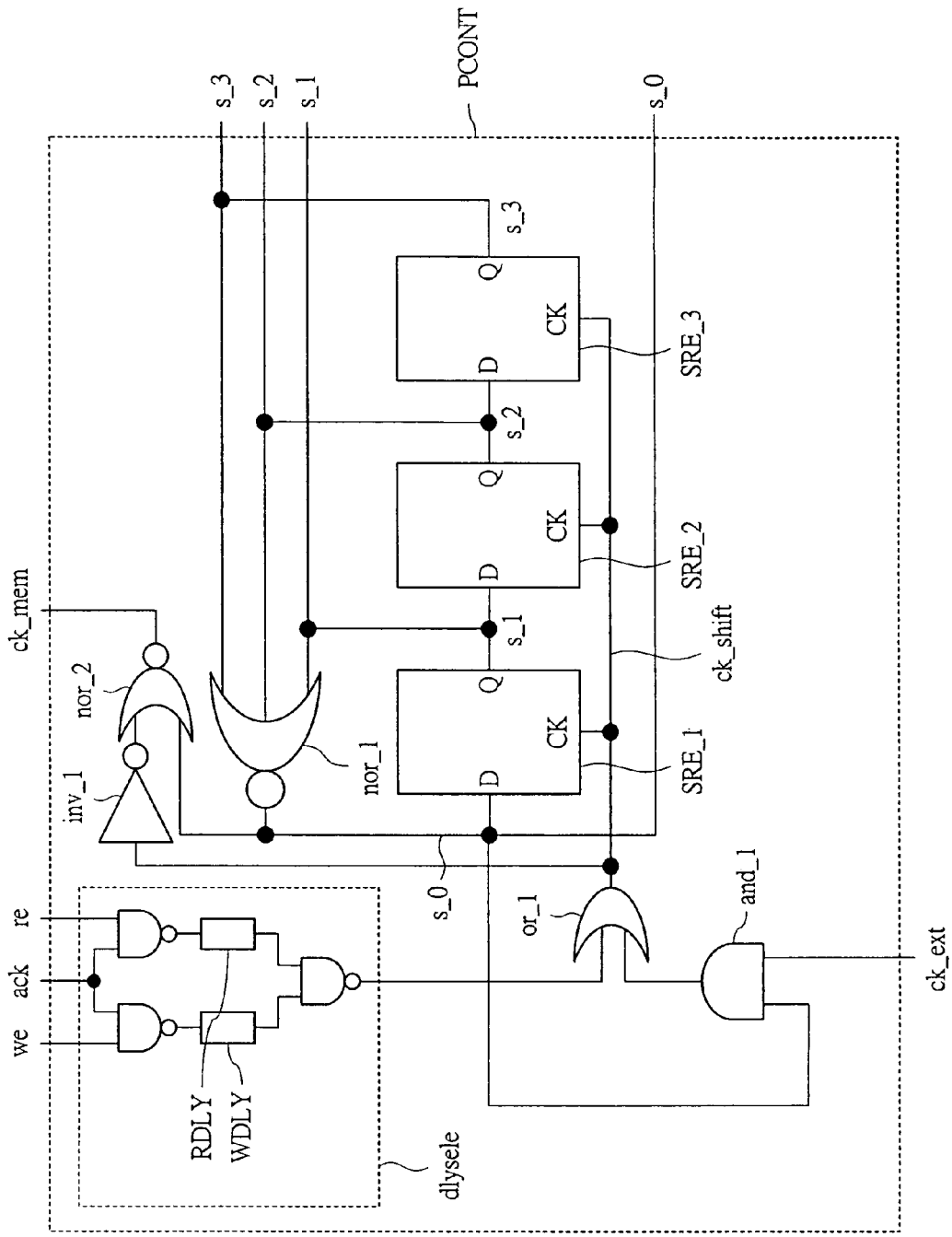
FIG. 19 is a circuit diagram showing a configuration of a time sharing control signal generating circuit PCONT added with a circuit that can adjust timings at which an ack signal generates ck_shift and ck_mem differently in a writing operation and a reading operation according to an eighth embodiment of the present invention.

FIG. 19 shows a circuit configuration of PCONT according to the eighth embodiment of the present invention. As shown in FIG. 19, the eighth embodiment has a configuration that a circuit dlysele enclosed by a dotted line is added to PCONT of the first embodiment (FIG. 3). In FIG. 19, RDLY and WDLY are delay circuits whose delay times are different from each other. A signal we is a write enable signal and a signal re is a read enable signal, and the signals are inputted into a port externally. The signals are for controlling whether 1PRAM performs a write operation or a read operation.

In the eighth embodiment, when the signal we is HIGH and the signal re is LOW, 1PRAM performs a write operation, and when the signal re is HIGH and the signal we is LOW, 1PRAM performs a read operation. As shown in FIG. 19, in the circuit dlysele, a signal that has passed through the delay circuit WDLY produces a waveform at a write operation according to a combination of a NAND circuit. A signal that has passed through the delay circuit RDLY produces a waveform at a read operation.

According to the eighth embodiment, generation timings of signals ck_shift and ck_mem generated from an ack signal can be adjusted according to a write operation or a read operation, respectively.

Ninth Embodiment

A ninth embodiment of the present invention has a configuration that a delay circuit that delays an ack signal is added within 1PRAM to the ack signal generating circuit (FIG. 7) of the first embodiment. The configuration of this embodiment except for the ack signal generating circuit is the same as that of the first embodiment.

Figure 20:
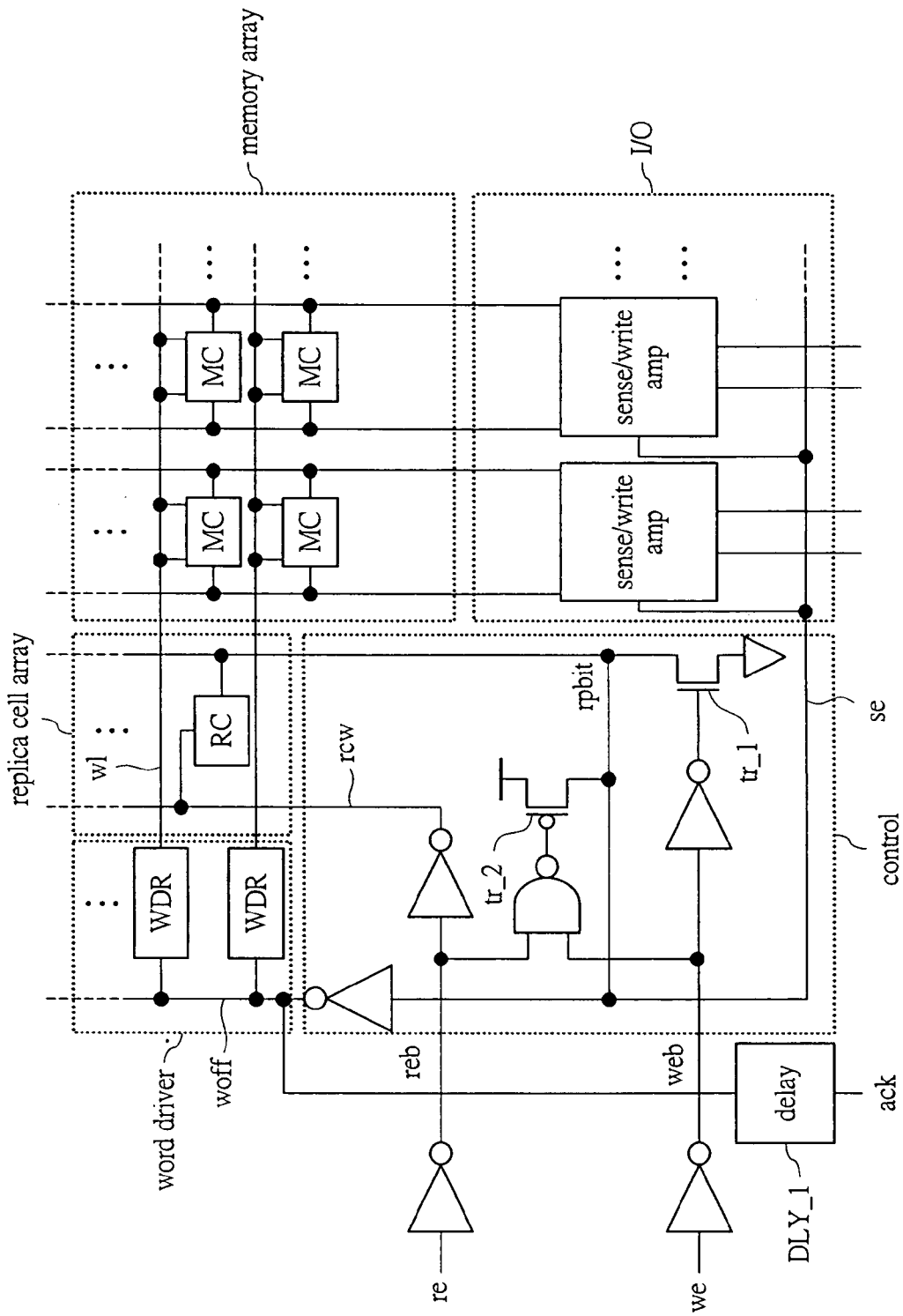
FIG. 20 is a circuit diagram showing a configuration of a circuit added with a delay circuit for adjusting a timing of outputting an ack signal to a word line falling signal generating circuit in an SRAM according to a ninth embodiment of the present invention.

FIG. 20 shows a configuration of an ack signal generating circuit within 1PRAM according to the ninth embodiment of the present invention. As shown in FIG. 20, the ninth embodiment has a configuration that a delay circuit DLY_1 is added to the ack signal generating circuit (FIG. 7) of the first embodiment.

According to the ninth embodiment, by adding the delay circuit to the ack signal generating circuit within 1PRAM, adjustment of an ack signal output timing becomes easy.

Tenth Embodiment

A tenth embodiment of the present invention has a configuration that a circuit in which different delay of an ack signal can be selected between a read operation and a write operation is added to the ack signal generating circuit (FIG. 7) of the first embodiment. The other circuit configuration of the embodiment is the same as that of the first embodiment. A feature of the tenth embodiment lies in that a delay circuit for adjusting an output timing of an ack signal is added within 1PRAM.

Figure 21:
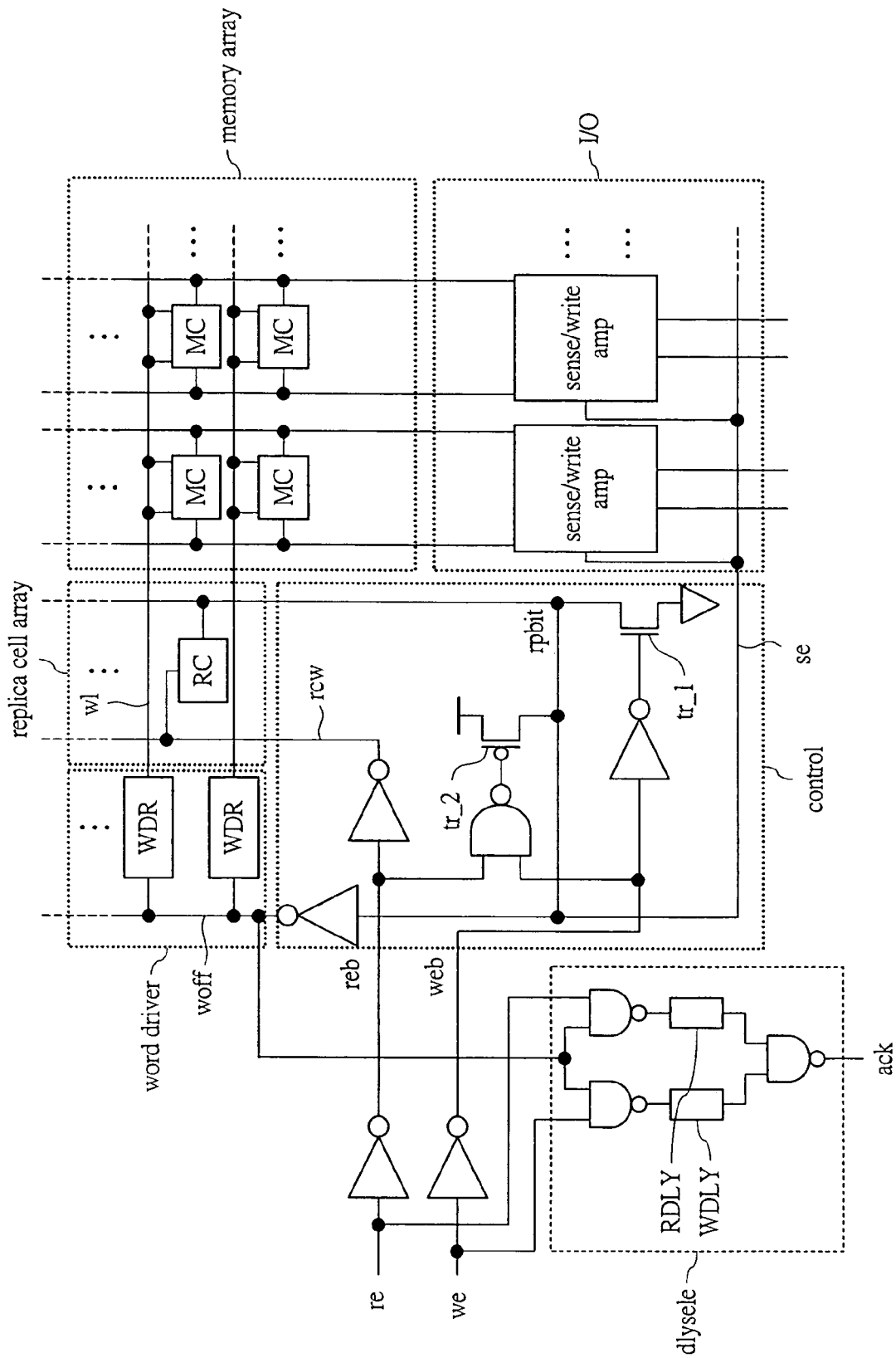
FIG. 21 is a circuit diagram showing a configuration of a circuit added with a circuit that can adjust a timing of outputting an ack signal to a word line falling signal generating circuit in an SRAM differently in a writing operation and a reading operation according to a tenth embodiment of the present invention.

FIG. 21 shows a configuration of an ack signal generating circuit within 1PRAM according to the tenth embodiment. As shown in FIG. 21, the tenth embodiment has a configuration that a circuit dlysele is added to the ack signal generating circuit (FIG. 7) according to the first embodiment so that an output timing of an ack signal can be adjusted differently between a write operation and a read operation. RDLY and WDLY are delay circuits whose delay times are different from each other. According to a combination with an NAND circuit, a waveform that has passed through the delay circuit RDLY is outputted as an ack signal at a read operation and a waveform that has passed through the delay circuit WDLY is outputted as an ack signal at a write operation.

According to the tenth embodiment, adjustment of an output timing of an ack signal outputted from 1PRAM corresponding to a read operation and a write operation become easy.

Eleventh Embodiment

An eleventh embodiment of the present invention has a configuration that a flip flop circuit is used as a data holding circuit of each port instead of the latch circuit in the first embodiment (FIG. 1).

Figure 22:
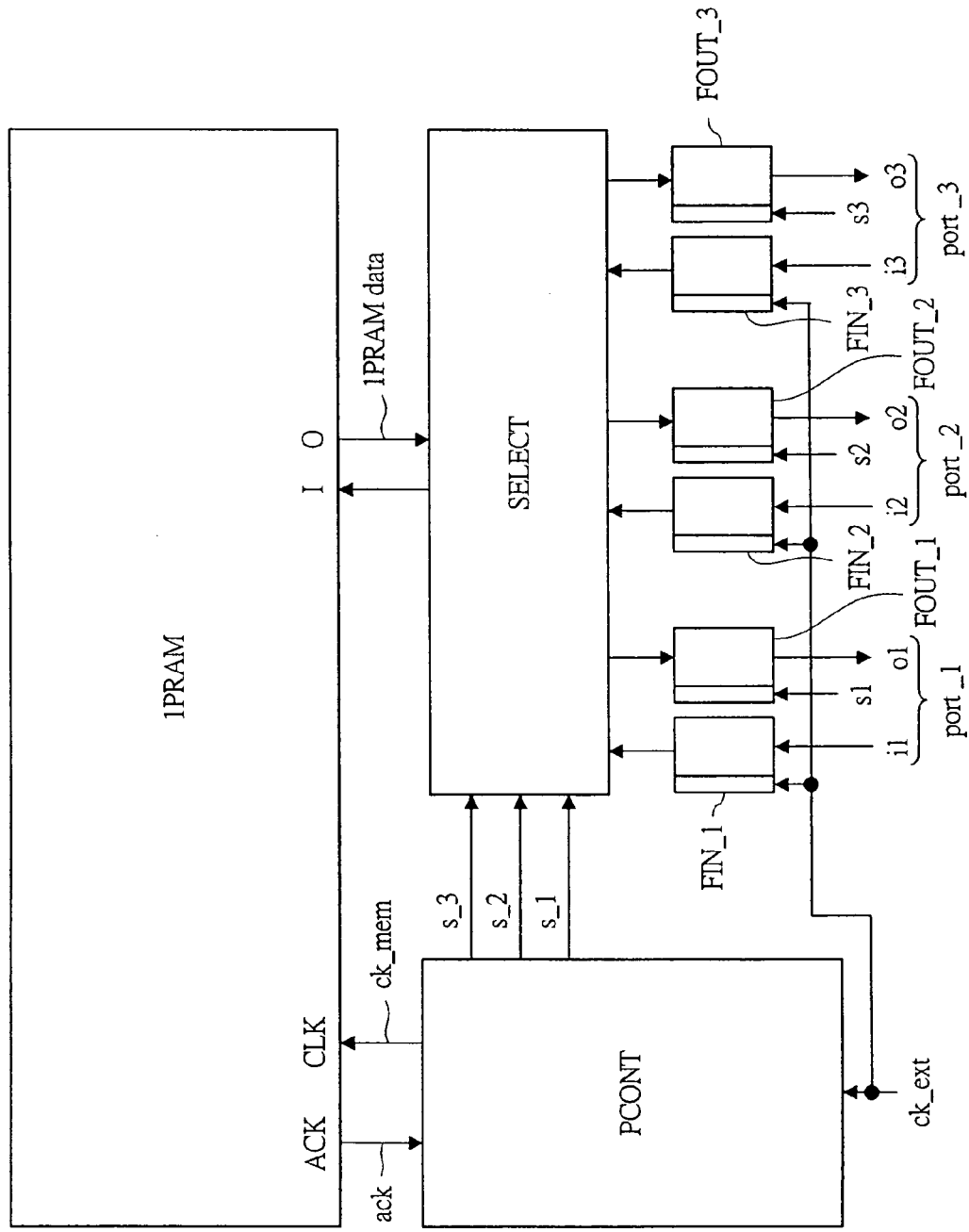
FIG. 22 is a block diagram showing a configuration of a time sharing virtual multi port memory using a flip flop in an input/output signal with the outside holding circuit according to an eleventh embodiment of the present invention.

FIG. 22 shows a configuration of a time sharing virtual multi port memory according to the eleventh embodiment. A circuit shown in FIG. 22 has a configuration that flip flop circuits FIN_1 to FIN_3 and FOUT_1 to FOUT_3 are used instead of the latch circuits LIN_1 to LIN_3 and LOUT_1 to LOUT_3. The other circuit configuration of this embodiment is the same as that of the first embodiment (FIG. 1). In the eleventh embodiment, an external clock signal ck_ext is used as a data input control signal for signals to the inside. Signals s1 to s3 are used as data output control signals for signals to the outside.

Figure 23:
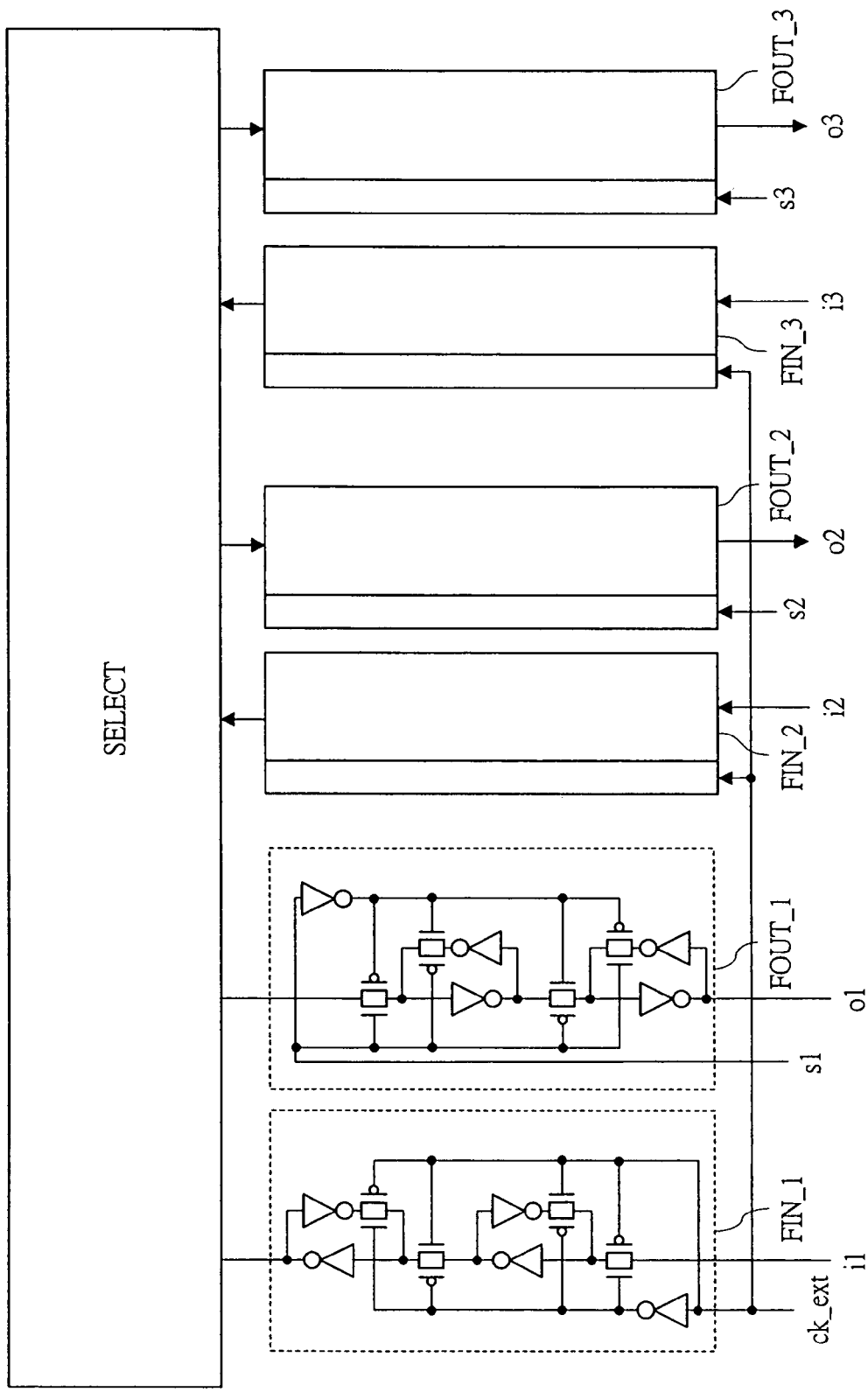
FIG. 23 is a circuit diagram showing a detail configuration of the input/output signal holding circuit according to the eleventh embodiment of the present invention.

FIG. 23 is a detail circuit diagram of the flip flop circuits FIN_1 to FIN_3 and FOUT_1 to FOUT_3.

Note that, in FIG. 22 and FIG. 23, i1 to i3 correspond to ce1 to ce3, we1 to we3, a1 to a3 [0 to 9], and d1 to d3 [0 to 11], o1 to o3 correspond to q1 to q3 [0 to 11], I corresponds to CE, WE, A [0 to 9], and D [0 to 11], and O corresponds to Q [0 to 11].

Figure 24:
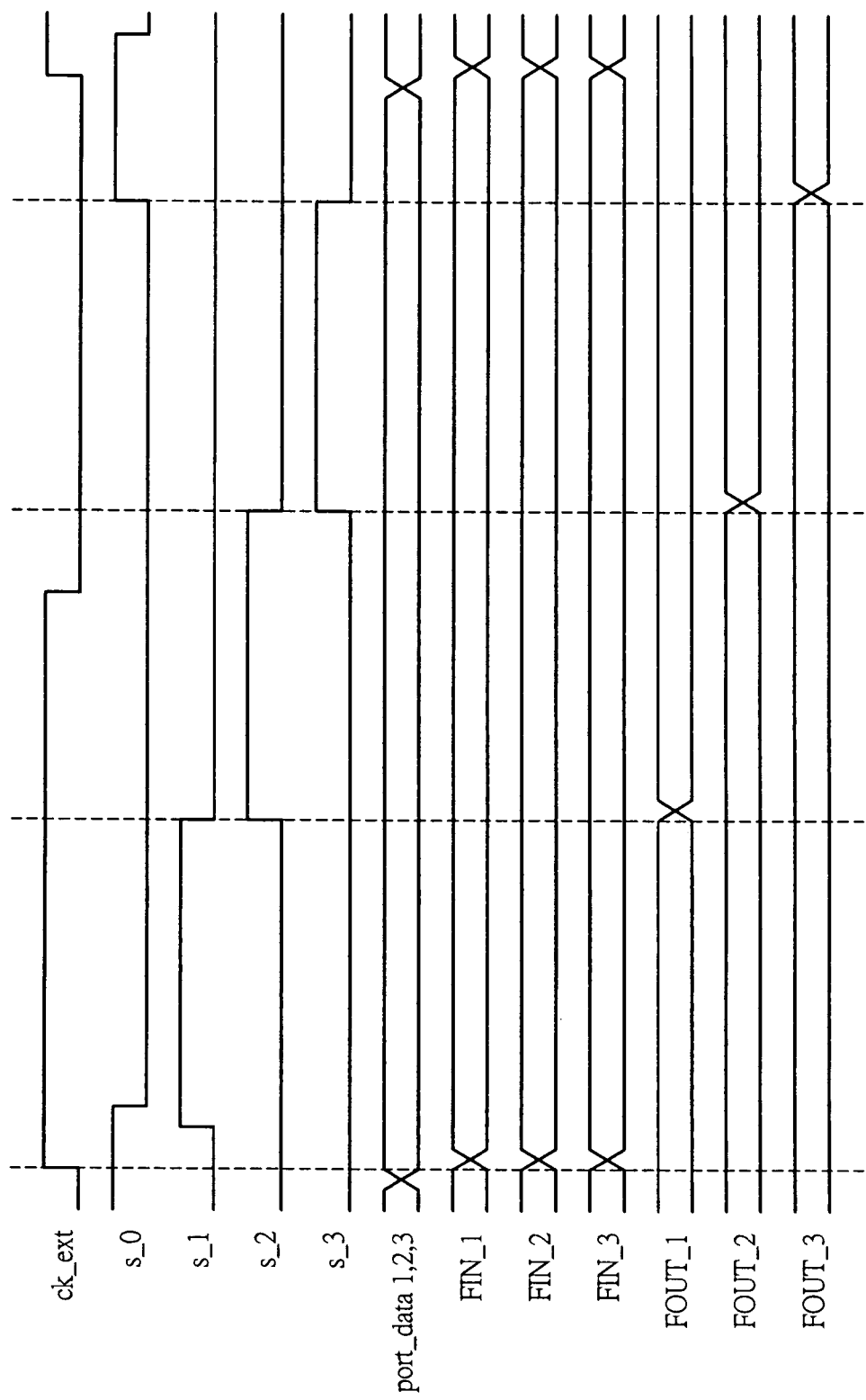
FIG. 24 is a timing chart showing an operation of the time sharing virtual multi port memory using a flip flop in an input/output signal with the outside holding circuit according to the eleventh embodiment of the present invention.

FIG. 24 shows an operation timing chart of FIN_1 to FIN_3 and FOUT_1 to FOUT_3. As shown in FIG. 24, FIN_1 to FIN_3 take in input data from the outside to hold the same at a rising of an external clock signal ck_ext. FOUT_1 to FOUT_3 take in output data from 1PRAM to hold the same at falling of s_1 to s_3 and output the data to the outside.

Thus, according to the eleventh embodiment, since taking-in and holding of record are performed at an edge operation, timing design of an operation is facilitated.

Twelfth Embodiment

FIG. 25 is a block diagram showing a configuration of a semiconductor integrated circuit device according to a twelfth embodiment of the present invention.

In FIG. 25, 1PRAM is a single port memory, PCONT is a circuit for generating control signals s_0 and ck_mem, LIN_1 is a latch circuit for holding input data i1 from the outside at a rising of a signal ck_ext, and LOUT_1 is a latch circuit that holds output data o1 of 1PRAM at rising of a control signal s_0 to output the same to the outside. PCONT has such a circuit configuration as shown in FIG. 3, FIG. 9, FIG. 12, FIG. 16, FIG. 18, or FIG. 19.

A signal ck_ext is an external clock signal, a signal ck_mem is an operation start signal of 1PRAM inputted from PCONT, and a signal ack is an operation termination signal of 1PRAM. In this configuration, read data can be outputted from LOUT_1 to the outside regardless of an external clock, utilizing the operation termination signal ack of 1PRAM after operation termination of 1PRAM.

FIG. 26 is an operation timing chart of the circuit shown in FIG. 25. As shown in FIG. 26, a control signal s_0 put in HIGH is caused to fall at rising of ck_ext so that an operation start signal ck_mem of 1PRAM is generated. 1PRAM starts its operation due to input of ck_mem and outputs an operation termination signal ack at an operation termination so that a control signal s_0 rises and data is outputted from LOUT_1.

Therefore, according to the twelfth embodiment, it is possible to output data to the outside in synchronization with operation termination of the memory.

The invention that has made by the present inventors has been specifically explained above based upon the embodiments, but the present invention is not limited to the above embodiments and it may be modified variously without departing from the gist of the invention, of course.

For example, in the embodiments, the case of SRAM has been explained as the case of single port memory (1PRAM), but the invention is not limited thereto and it can be applied to another memory such as DRAM or EPROM.

What is claimed is:

1. A semiconductor integrated circuit device comprising:
   a single port memory including an internal memory and a first port adapted to input first data to be stored in said internal memory and to output a first state signal that indicates an end of a writing operation of said first data to said internal memory; and
   a multi port control circuit including a second port, into which second data is inputted from an outside of the semiconductor integrated circuit device, and a third port, into which third data is inputted from said outside of the semiconductor integrated circuit device, the multi port control circuit adapted to output said second data to said first port as said first data, and said third data to said first port as said first data,
   wherein said first state signal is inputted into said multi port control circuit, and
   wherein said multi port control circuit switches data output to said first port as said first data from said second data to said third data based on said first state signal.

2. The semiconductor integrated circuit device according to claim 1,
   wherein said multi port control circuit outputs said second data as said first data during a first period, and outputs said third data as said first data during a second period that is different from said first period, and
   wherein said multi port control circuit further includes a time sharing control signal generating circuit generating a first period control signal to indicate said first period, and a second period control signal to indicate said second period, and includes a selector that selects one of said second data and said third data, based on said first period control signal and said second period control signal, to output to said first port as said first data, wherein in case of outputting said first period control signal to said selector, said time sharing control signal generating circuit stops an output of said first period control and starts an output of said second period control signal, when said first state signal is inputted into said time sharing control signal generating circuit.

3. The semiconductor integrated circuit device according to claim 2, wherein said multi port control circuit further includes a first data latch circuit connected to said second port and into which said second data is inputted, and a second data latch circuit which is connected to said third port and into which said third data is inputted.

4. The semiconductor integrated device according to claim 3, wherein said multi port control circuit includes plural ports including said second port and said third port, and outputs plural data including said second data and said third data as said first data, and wherein said single port memory outputs a second state signal to indicate an end of a writing operation of said plural data into said internal memory, and wherein said multi port control circuit includes plural data latch circuits including said second data latch circuit and said third data latch circuit, and generates a third period control signal to indicate a third period, based on said second state signal, wherein said plural data are inputted to said plural data latch circuits in parallel, in said third period.

5. The semiconductor integrated circuit device according to claim 3, wherein, when said selector selects neither said second data nor third data as said first data, said time sharing control signal generating circuit generates a third period control signal to indicate a third period when said second data is inputted into said first data latch circuit and said third data is inputted into said second data latch circuit.

6. The semiconductor integrated circuit device according to claim 2, wherein said time sharing control signal generating circuit further includes a first shift register and a second shift register to store a shifted value held in said first shift register, based on said first state signal, and wherein said time sharing control generating circuit generates said first period control signal based on an output value of said first shift register, and shifts a value held in said first shift register to said second shift register when said first state signal is inputted into said sharing control signal generating circuit, and generates said second period control signal based on an output value of said second shift register.

7. The semiconductor integrated circuit device according to claim 6, wherein said time sharing control signal generating circuit generates a third period control signal to indicate a third period when said second data is inputted into said first data latch circuit and said third data into said second data latch circuit in parallel, when said selector selects neither said second data nor said third data based on said first shift register and said second with register, to input to said first port as first data.

8. The semiconductor integrated circuit device according to claim 2, wherein said time sharing control signal generating circuit further includes a first shift register and a second shift register to store a shifted value held in said first shift register, based on said first state signal, wherein said first shift register and said second shift register form a ring counter, and wherein said time sharing control signal generating circuit generates said first period control signal based on an output value of said first shift register, and shifts a value held in said first shift register to said second shift register when said first state signal is inputted into said time sharing control signal generating circuit, and generates said second period control signal based on an input value of said second shift register.

9. The semiconductor integrated circuit device according to claim 1, wherein said single port memory further receives an input address with said first data, and wherein said multi port control circuit fixes a specific bit of said input address to a first value when said multi port control circuit outputs said second data to said first port as said first data, and fixes said specific bit of said input address to a second value that is different from said first value when said multi port control circuit outputs said third data to said first port as said first data.

10. The semiconductor integrated circuit device according to claim 1, wherein said multi port control circuit further includes a clock input part into which an external clock is inputted, and starts outputting said first data based on said external clock inputted through said clock input port.

11. The semiconductor integrated circuit device according to claim 10, wherein ports into which data is inputted from an outside of said multi port control circuit consist of plural ports, and wherein time of outputting data from said plural ports to said first data as said first port shorten a cycle of the external clock.

12. The semiconductor integrated circuit device according to claim 4, wherein said time sharing control signal generating circuit further includes a delay circuit that delays said first state signal, and wherein said delay circuit into which said first state signal is inputted delays at least one of said first to third periods.

13. The semiconductor integrated circuit device according to claim 3, wherein said data latch circuit further includes a circuit that holds data inputted from said outside of said multi port control circuit, and a circuit that holds data outputted to said outside of said multi port control circuit.

14. The semiconductor integrated circuit device according to claim 1, wherein said single port memory is an SRAM.

15. The semiconductor integrated circuit device according to claim 1, wherein said single port memory further includes a word line driven by a word driver when said internal memory is read or written, and a bit line into which a signal is transferred from memory cell that is activated by said word line, and a sense amplifier that amplifies a transferred signal from said bit line, and wherein said first state signal is generated based on falling of said word line signal or a driving signal of said sense amplifier.

* * * * *